United States Patent [19]
Byrum

[11] Patent Number: 4,681,656
[45] Date of Patent: Jul. 21, 1987

[54] IC CARRIER SYSTEM

[76] Inventor: James E. Byrum, 1203 Countrywood La., Vista, Calif. 92083

[21] Appl. No.: 729,228

[22] Filed: May 1, 1985

Related U.S. Application Data

[63] Continuation-in-part of Ser. No. 468,415, Feb. 22, 1983, abandoned.

[51] Int. Cl.$^4$ ............ C23F 1/02; B44C 1/22; B23K 9/00; C25D 5/02
[52] U.S. Cl. .................. 156/645; 29/827; 29/851; 156/151; 156/252; 156/272.8; 156/643; 156/89; 156/656; 156/666; 204/15; 204/38.4; 219/121 LL; 219/121 LM; 174/68.5; 361/406; 361/421
[58] Field of Search ............. 219/121 LK, 121 LL, 219/121 LM; 204/15, 38.4; 357/65, 70; 29/827, 846, 851; 428/134, 621, 630, 635, 636, 596, 601; 174/68.5; 264/61; 361/404–406, 412, 421; 156/150, 151, 89, 252, 272.8, 643, 645, 656, 659.1, 666

[56] References Cited

U.S. PATENT DOCUMENTS 3,882,059  5/1975  Elderbaum .............. 156/89 X
3,926,746  12/1975  Hargis .................. 156/89 X Primary Examiner—William A. Powell
Attorney, Agent, or Firm—Albert L. Gabriel

[57] ABSTRACT

A method of laser-machining IC carrier bodies from a sheet ceramic blank, and the IC carrier products produced from such laser-machining. The ceramic blank, preferably of alumina or beryllia, is high temperature fired to permanently fix its size and shape prior to the laser-machining, permitting a matrix of IC carrier bodies to be laser-machined to close tolerances, whereby metallization conductors can be located on the bodies also to close tolerances, and lower temperature firing may be employed to fix such conductors without disturbing any of the tolerances. Novel elongated peripheral groove vias in the carrier bodies permit the sequential laser-machining of elongated slots to form the via grooves and scribe recesses. The novel elongated slot via grooves permit efficient vacuum drawing of metallization paste through the slots and restriction of the metallization to flat sides of the slots whereby insulative slot ends enable all carriers in a matrix to be electrically isolated for multiple electrical testing of the carriers in matrix or array form.

30 Claims, 26 Drawing Figures

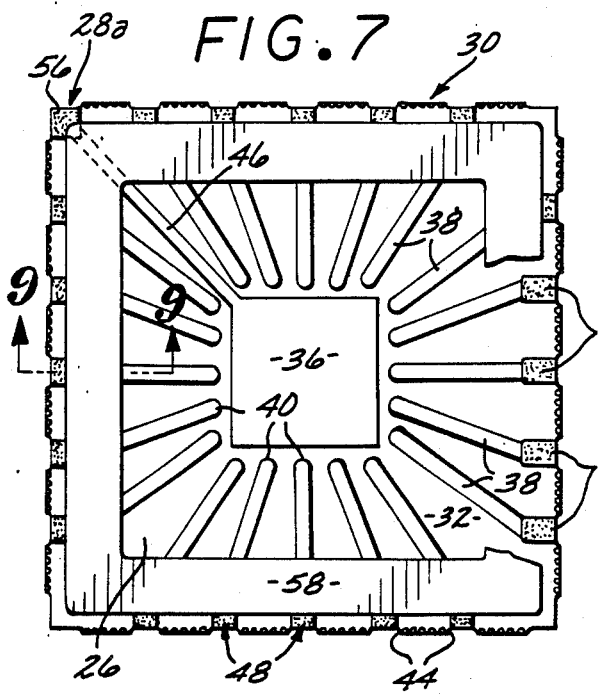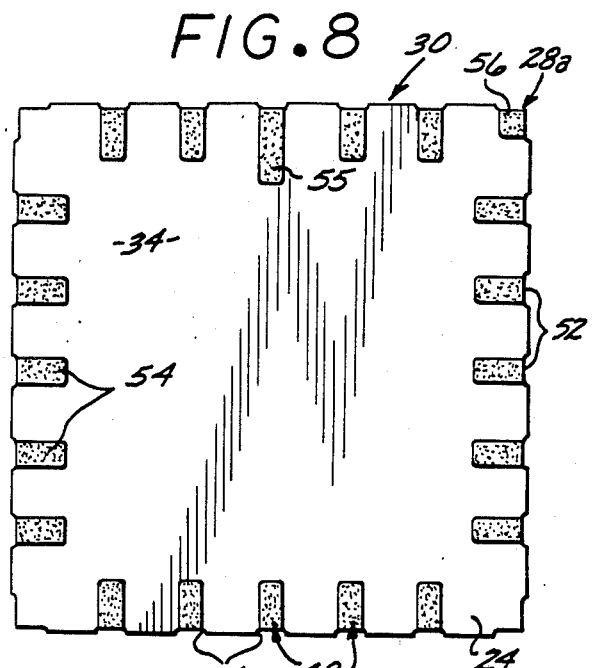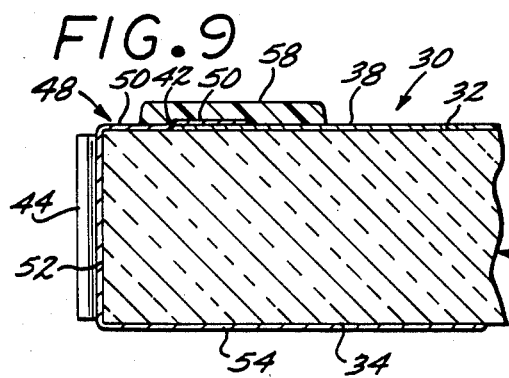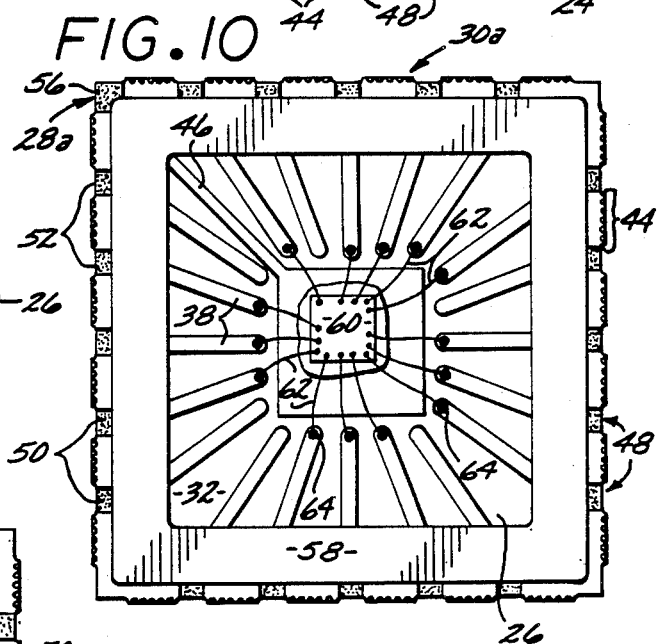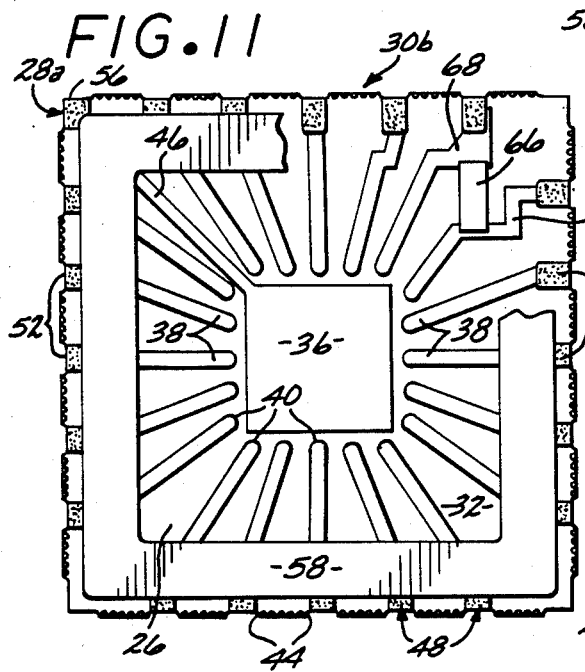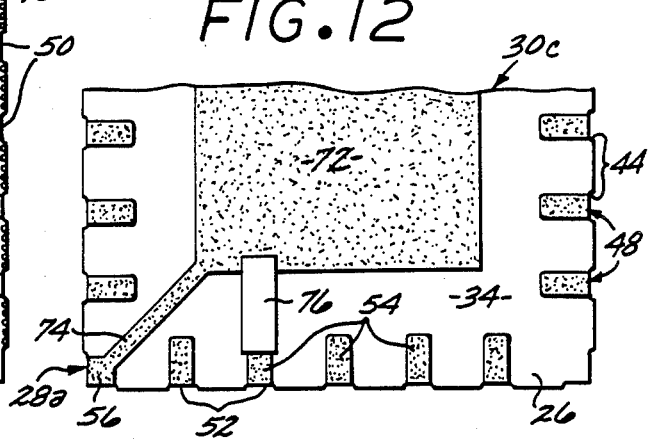

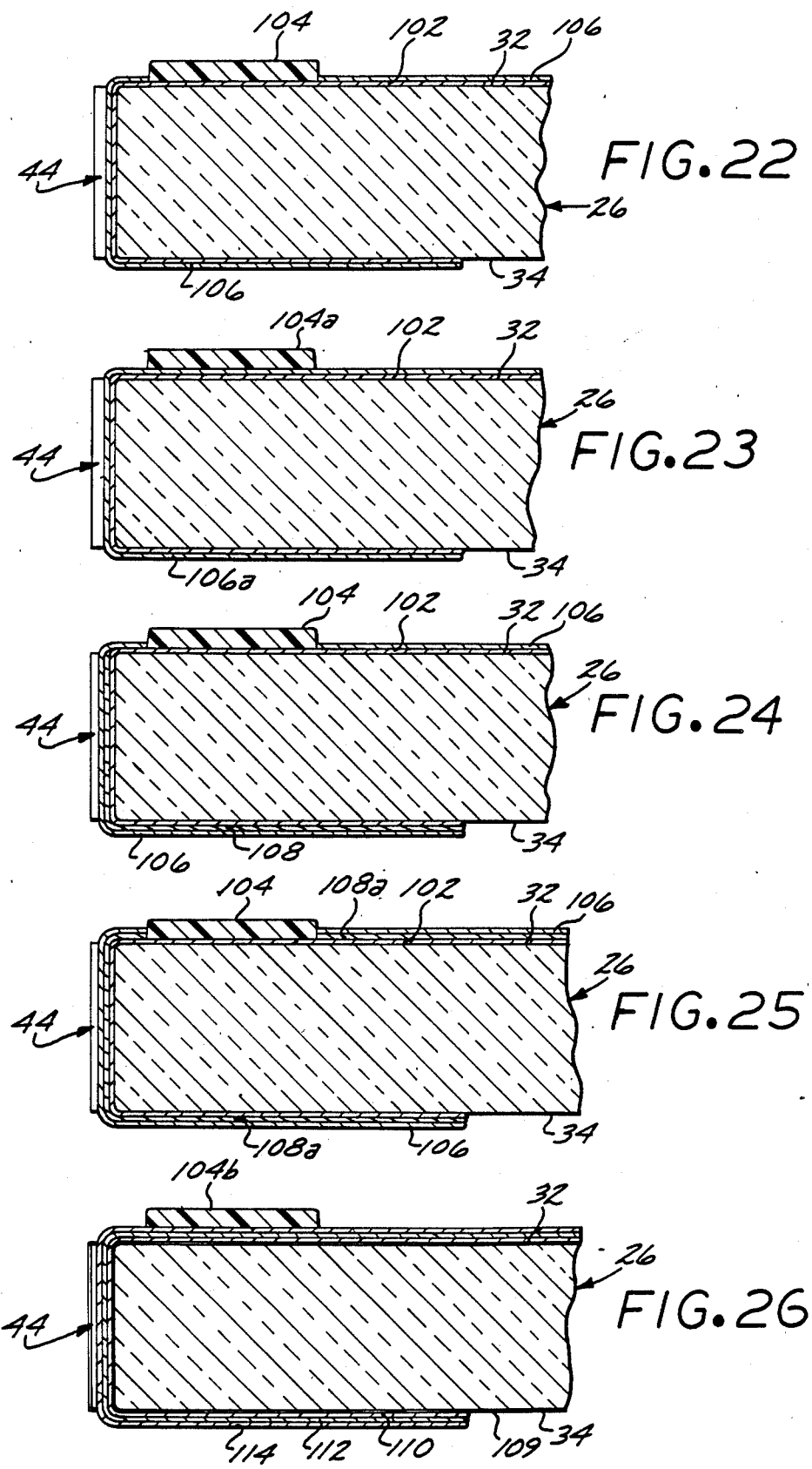

IC CARRIER SYSTEM

BACKGROUND OF THE INVENTION

1. Field of the Invention

The invention is in the field of integrated circuit (IC) packages and methods for making them.

2. Description of the Prior Art

Each semiconductor IC chip is required to be electrically and mechanically connected to a package or carrier for interfacing with a printed circuit or "mother" board and for protection from the environment and from workers because of the delicacy and almost microscopic size of the chip and its input/output wires.

The conventional IC chip package which has been the standard for many years is the "dual in-line package" (DIP), which is an elongated, rectangular ceramic package. However, the increasingly rapid advances in solid state technology with associated progressive miniaturization, increasing lead counts, and requirement for shorter and more uniform conductive trace lengths, have made the DIP with leads on only two sides increasingly inadequate. Thus, the relatively small ratio of a DIP's active device to package area results in an inefficient use of printed circuit board space, and may also cause handling problems with higher lead count designs. The size of a DIP is governed primarily by the number of leads required, and not by the size of the IC which it packages. Thus, as the number of leads increases the overall DIP size grows much more rapidly than the IC. For example, the die cavity in an 18 lead DIP is approximately 16 percent of the package area while the die cavity in a 64-lead DIP is only approximately 4 percent of the package size.

The internal conductive traces of a DIP are of widely differing lengths, becoming increasingly longer toward the longitudinal ends of the DIP. The inherent length of the internal traces toward the ends of the DIP, and the difference in lengths of the traces of a DIP, cannot always satisfy the electrical requirements of a high performance system.

Although DIP's still represent more than approximately half of the IC packages, because of their aforesaid inadequacies, the small, square ceramic "chip carrier" is coming into progressively increasing usage. The IC chip carrier has full peripheral contact geometry, and this results in greatly increased package density and area utilization, better and more uniform electrical performance, and more economical device packaging. To illustrate the greatly increased utilization of space, an 18-lead chip carrier with the same die cavity as a DIP utilizes only approximately 42 percent of the package area, while a 64-lead chip carrier utilizes only approximately 20 percent of the package area of the DIP.

However, despite such favorable aspects of ceramic chip carriers over DIP's, conventional prior art methods for manufacturing ceramic chip carriers have, in general, resulted in products with poor tolerances. These poor tolerances are exemplified by the specifications conventionally placed on ceramic chip carriers, which are plus or minus 1 percent or 0.003 inch, whichever is the greater. This could include irregularities as large as plus or minus 40 mils (0.040 inch) for a 4 inch by 4 inch array or matrix of 25 ceramic chip carriers, which is a conventional format employed during production of the carriers. One big disadvantage of such poor tolerances was that automatic die attaching equipment could not be employed for rapid attachment and electrical connection of chips to the carriers in array form. Another disadvantage of these poor tolerances was that reliable results could not be achieved with automatic testing equipment for testing the integrity of the IC's after mounting on the array without singulation to individual chip carriers.

The primary reason for the poor tolerances of conventionally manufactured ceramic chip carriers was that the round holes which provided semicylindrical peripheral recesses in the carriers and the scribe lines defining the edges of the carriers were cut when the ceramic blank was still in its "green" or plasticized stage. This cutting was accomplished by a sort of cookie cutter having tungsten carbide dies including round punches for punching out the holes and a razor die for cutting the scribe lines. Such mechanical die cutting could not be performed after the blank had been fired at high temperatures to sinter the particulate ceramic of the blank together and to vaporize off the organic binders in the blank because the ceramic material usually required for the chip carriers was alumina ($Al_2O_3$), which is an extremely hard and abrasive material. Then when the blank was fired at the required high temperatures (usually in excess of 1550° C.) to sinter the particulate ceramic together and vaporize out the organic binders, the blank underwent a generally uncontrollable shrinkage because of removal of the binder materials, flow of the ceramic particles during the sintering action itself, and variations in firing temperatures and atmospheres.

The resulting poor tolerances, and in particular, the uncertain locations of the semicylindrical peripheral recesses for the leads, required that the metallizing be done on the green blanks before high temperature firing. This not only resulted in poor tolerances of the metallization because of irregular shrinkage caused by high temperature firing, but also necessitated use of a high temperature metal such as tungsten or molybdenum-manganese for the metallization. Such high temperature metals have poor electrical conductivity, which then necessitated the further step of plating the metallization after the firing with a metal having good electrical conductivity and good solderability.

There are other problems in the prior art use of round holes to provide semicylindrical peripheral recesses in prior art ceramic IC carriers. One such problem is that the relatively large cross-sectional hole opening relative to peripheral surface area of the round holes made the vacuum drawing of metallizing paste through the holes very inefficient, most of the vacuum being wasted in the central part of the hole where the vacuum-created airflow had no useful effect on movement of the metallizing paste. Another such problem was that the continuous curvature of the round holes drew the metallizing paste all of the way around the holes due to capillary action and/or forces involved in the vacuum drawing, and it was not possible to selectively metallize internal portions of the semicylindrical peripheral recesses leaving nonmetallized insulative regions proximate the edges of the carriers. This resulted in electrical connection between all of the carriers in an array or matrix thereof, which prevented use of automatic testing equipment for testing the integrity of the IC's in array or matrix form, and required that the carriers first be broken apart before testing, and then tested individually.

Although a prefired, sintered ceramic blank can be readily cut or machined with a laser beam, prior attempts to cut round holes and scribe lines by means of a laser have been generally unsatisfactory and unduly costly, and therefore have not come into any appreciable use. While the scribing could be accomplished by straight-line movement of the laser beam, cutting round holes larger than 0.010 inch diameter with a laser was tedious and complex, requiring that the laser delivery head be stopped and then moved around in a tight circular orbit to machine or cut each of the holes.

Applicant is aware of no prior art teaching in which straight-line movement of a laser beam has been employed to machine alternating scribes and via slots or holes through a high temperature-sintered ceramic sheet for production of an array or matrix of IC chip carriers (via slots or holes being provided for metallized conductors from the tops to the bottoms of the carriers). The Tijburg U.S. Pat. No. 4,224,101 taught continuous scribing on a semiconductor disk by means of a YAG laser, and the Garibotti U.S. Pat. No. 3,112,850 taught continuous scribing of conductor wafers or ribbons, or alternatively alumina, beryllia, or other materials, using a high energy electron beam. However, neither Tijburg nor Garibotti taught the possibility of alternately scribing and machining slots or holes, and in particular, neither Tijburg nor Garibotti taught how such alternate scribing and machining of slots or holes could be accomplished, or suggested any type of equipment that might be used to perform such alternate scribing and machining of slots or holes. Neither the YAG laser of Tijburg nor the electron beam of Garibotti would be capable of such sequential scribing and machining of slots or holes in a high temperature-sintered ceramic blank.

The Ramspacher, Jr. U.S. Pat. No. 4,366,198 taught straight-line sequences of diamond-shaped apertures and elongated slots in a printed circuit board substrate for providing a break line. However, the Ramspacher, Jr. teaching was to punch out the diamond-shaped apertures and slots, which was readily accomplished with the relatively easily-worked insulating circuit board material of Ramspacher, Jr. such as phynolic material or an epoxy/fiberglass sandwich. Ramspacher, Jr. taught diamond-shaped apertures which were squares 0.062 inch on a side, which could readily be punched out but would require a completely impractical amount of back and forth and lateral movement if a laser were attempted to be used. The large size of the apertures and slots, and the diamond shape of the apertures, would preclude any straight-line laser movement to produce the Ramspacher, Jr. break line.

Prior to the present invention, flat leads or input/output terminals have been difficult to use for IC chip carriers despite the potential advantages of increased contacting area with the metallization conductors of the carrier and simplified manufacture of the terminals by stamping. It is difficult to achieve a good mechanical connection between flat leads and the prior art semicylindrical lead notches. The prior art round holes did not provide enough cross-sectional space for use of paired or double leads insulated from one another, so that if it were desired to leave an array of chip carriers connected together, only a single round pin could be used in each hole, whereby the conductors of adjacent carriers leading to that pin would both have to be connected to the same electrical location on a circuit board, and in many cases only one of them therefore was usable.

Also not done in this art prior to the present invention was to put circuit components such as resistors, capacitors, moisture sensors, or the like directly on an IC chip carrier, although there is frequently a need for one or more of such components in a chip carrier. For example, it is often an advantage to protect one of the chip inputs from static surges, or to condition the electrical output of an IC before the electrical signal leaves the package, and this could most conveniently be accomplished by a ribbon of resistor material right on the surface of the chip carrier between the corresponding input conductive trace of the carrier and ground or common bus conductive trace of the carrier. It is believed that such circuit components have not heretofore been provided directly on IC chip carriers because of the difficulties of properly locating and sizing such circuit components relative to the poor tolerances of the conductive traces and metallization conductors of the carriers. Also, available resistor materials for this purpose generally require air-firing, typically at approximately 850° C., which had to be done after the conventional metallization with tungsten or molybdenum-manganese had been completed; however, exposure of such metallization to air atmospheres at temperatures over about 600° C. would result in oxidation of the metallization with subsequent electrical and physical quality degradation.

SUMMARY OF THE INVENTION

In view of these and other problems in the art, it is a general object of the present invention to provide a novel method of manufacturing ceramic IC carriers to much closer tolerances than they were capable of being manufactured with the use of conventional prior art methods.

Another object of the invention is to provide IC carriers which, because of their manufacture to extremely close tolerances, are particularly suitable for use in increasingly miniaturized microelectronic circuits.

Another object of the invention is to provide IC carriers which, because of their manufacture to very close tolerances, enable the use of automatic die and wire attaching equipment for the rapid and efficient attachment and electrical connection of IC chips to the carriers in matrix or array form.

A further object of the invention is to provide IC carriers which, because of their accuracy of manufacture, and because of a novel via configuration and metallization which provides electrical isolation of each carrier from all of the other carriers in a matrix or array thereof, enable use of automatic testing equipment for testing the bonded IC chips in matrix or array form.

A further object of the invention is to provide a novel laser method of manufacturing ceramic IC carriers preferably made of high temperature-sintered alumina or beryllia, which enables the machining or cutting of a matrix or array of the carriers from a blank to be performed subsequent to the primary high temperature firing which has permanently fixed the exact shape and size of the blank, whereby the resulting IC carriers have extremely close overall tolerances, including the tolerances of peripheral recesses or castellations for the attachment of leads or terminals, and whereby all of the conductive metal can be applied after the primary firing which enables the metal to be very accurately located in the final product, and enables the metallization to be of a highly conductive noble metal composition such as gold, platinum/ palladium/silver, and other noble metals, as well as copper.

A further object of the invention is to provide a novel simplified laser machining or cutting method which enables the laser beam to be moved entirely in straight lines, avoiding the necessity for circularly orbiting or otherwise transversely or reversely moving the laser at each recess which would materially increase production time and cost.

A still further object of the invention is to provide a novel laser machining technique for machining a series of alternating grooves and scribes, wherein a single laser generator is enabled to machine both the slots and scribes in the sequence by utilization of a laser beam in the middle infrared radiation range, preferably a carbon dioxide laser, having the necessary heat generating capability to vaporize through the very hard ceramic material to produce the slots, yet which may also be utilized to produce scribes by machining a series of discrete conical scribe recesses rather than continuous scribe lines which would normally require interposition of a second laser generator of a different type.

Yet a further object of the invention is to provide ceramic IC carriers which have a novel elongated, flat-bottomed peripheral groove or castellation configuration for receiving via metallization in the flat bottoms thereof that for the first time makes it practical to laser-machine the grooves and scribes, and consequently enables the machining to be performed after the primary firing.

Another object of the invention is to provide improved efficiency in the vacuum drawing of metallization paste through via holes in a matrix or array of ceramic IC carriers by having such holes in the form of elongated, flat-sided slots and providing the metallization on such flat sides, with minimal spacing between the flats of the slots which avoids wasting of vacuum.

Another object of the invention is, by the provision of flat-sided via slots in an array or matrix of ceramic IC carriers, to permit isolation of via metallization in the flat sides of the slots, which become flat bottoms of peripheral grooves or castellations of the individual carriers, whereby each of the individual IC carriers in the matrix or array is completely electrically isolated from all of the other carriers, thereby enabling the IC's after attachment to the carriers to be electrically tested prior to committing a possibly faulty IC to an assembly of other components while the carrier is still in the matrix or array form. It is very difficult and costly to test and rework a completed circuit and to isolate a bad component.

A further object of the invention is to provide ceramic IC carriers which, because of the novel elongated, flat-bottomed peripheral via grooves or castellations thereon, enable flat leads to be used for improved mechanical connection to the metallization and for simplified manufacture of the leads by stamping, and which further enable peripheral grooves to be provided on the IC carriers that are of a size and configuration permitting the use of paired, sandwiched leads between adjacent carriers in a connected array of the carriers.

A still further object of the invention is to provide a novel laser method of manufacturing ceramic IC carriers wherein the laser machining or cutting of a matrix or array of the carriers from a sheet ceramic blank subsequent to the primary high temperature firing of the blank enables several alternative metallization application techniques or methods to be utilized with lower temperature subsequent firings to fuse and fix the metallization to the ceramic, and in some cases the plating of the metallization on the ceramic with or without lower temperature firings, such lower temperature firings and platings not disturbing the permanently fixed and exact shape and size of the blank, resulting in IC carriers which have extremely close metallization tolerances, suitable for use of automatic die and wire attaching equipment and also use of automatic electrical testing equipment.

An additional object of the invention is to provide IC carriers of sufficient accuracy to enable circuit components such as resistors, capacitors, or others, to be embodied thereon, and making the carriers particularly suitable for use with currently evolving hybrid integrated circuits.

According to the invention a sheet ceramic blank is fired at high temperature (generally above 1600° C.) to sinter the ceramic together and drive off organic binders prior to the laser machining or cutting of slots and break-off scribes to produce a matrix of interconnected IC carrier or package bodies so as to provide the carrier bodies with the closest possible tolerances, and as one consequence of such close tolerances to enable the detail-patterned metallization to be applied subsequent to the high temperature firing.

A sheet cermic blank, preferably of high temperature-sintered alumina or beryllia, is laser-machined on X and Y axes utilizing a laser in the middle infrared radiation range, preferably a carbon dioxide laser, with the laser beam cutting sequences of straight-sided slots and closely spaced scribe recesses. By machining slots instead of the conventional round holes, the laser beam is enabled to be moved entirely along straight lines and need not be stopped and orbited, or otherwise transversely or reversely moved, each time a hole is to be cut. Selective machining of the slots and scribe recesses is accomplished by employing a laser delivery system, preferably using a carbon dioxide laser, that provides separate, discrete pulses to produce the scribing recesses and overlapping pulses to produce the slots. The laser delivery system is adjustable on the Z or vertical axis and refocusable, being lowered to one level and refocused each time a slot is machined, and raised to another level and refocused each time a series of the discrete scribe recesses is machined. Discrete pulsing for the scribing, overlapping pulsing for cutting the slots, and movement of the laser delivery system in the X, Y and Z axes and focusing are all computer-controlled for precision.

According to the invention the laser machining is performed on the ceramic blank that has previously been high-temperature fired and sintered, and then all of the metal applications, including the metal pads, traces and metallization conductors, are applied by conventional means such as by a thick film screening process or by plating, and because of the accurate laser-machining on the already sintered blank, the metal can be extremely accurately located on the carrier bodies while they are still interconnected in matrix or array form, and in particular relative to the location of the via slots which define peripheral grooves or castellations in the carriers. The metallization is then fixed by secondary, lower temperature firing, and in one form of the invention in which electrolytic plating of the metallization is used, the secondary firing is not necessary. The resulting close tolerances of the ceramic structures of the IC carrier bodies and of the metal conductors thereon enable use of automatic die attaching equipment for reliable and rapid attachment and electrical connection of IC chips to the carriers, and also enable the carriers to be rapidly and conveniently tested in array form after attachment of IC chips.

Because the metallization is applied after the high temperature firing, there is no need to use a high temperature refractory metallization like that required in the prior art which had to be subsequently plated to improve its electrical conductivity and solderability, and a conventional metallization which has good electrical conductivity and solderability can be utilized, such as gold, a platinum/palladium/silver alloy, or other noble metals, as well as copper. Nevertheless, where customers still desire a refractory metal base bonded to the ceramic under a noble metal outer conductor, such refractory metal base, which may be tungsten or molybdenum-manganese, or a combination of these, can, according to one form of the invention, be applied and fired at a lower temperature after the primary high temperature firing of the ceramic, without disturbing the dimensional accuracy of the matrix or array of the ceramic carriers that was established in the initial primary firing.

Four principal alternative metallization application techniques or methods are utilized according to the invention. One method is to screen-print metallization paste directly onto surfaces of the carrier bodies which are attached in a matrix or array thereof, and then to fire the matrix at a relatively low temperature such as approximately 850°–900° C. to drive off binders of the film and sinter the metallization together and fix it onto the ceramic surfaces. Another metallization method of the invention is to first screen-print refractory metallization paste, such as molybdenum-manganese, tungsten, or a combination of these, and then fire the matrix at a relatively high temperature such as approximately 1400° C., which is still substantially below the primary ceramic firing temperature of approximately 1550° C. or higher, to drive off film binders and sinter and fix the refractory metal to the ceramic; and then to electroless plate gold or other noble metal onto the refractory metal and then preferably fuse and fix the gold or other noble metal with a relatively low temperature firing such as at approximately 950°–1000° C. This second method may also include an intermediate nickel plating between at least a portion of the refractory metal and the gold or other noble metal as a solder barrier. A third alternative method employs an initial overall very thin copper electroless plating on the ceramic, then a sequence of platings with photolithographic patterning, preferably of more copper, then nickel, and then gold or other noble metal, with a final etching off of the initial thin copper coating from the unpatterned areas of the ceramic, leaving the desired conductive traces. A fourth alternative method is known in the art as a "thin film" process, and is similar in concept to the third method. In the thin film method, an overall very thin sputtered film of titanium-tungsten is applied to the ceramic, an overall thin sputtered film of copper is applied over the titanium-tungsten film, and then a sequence of electrolytic platings is applied with photolithographic patterning, preferably of more copper, nickel, and then gold or other noble metal; then the sputtered layers are chemically etched from the unpatterned areas of the ceramic.

The peripheral grooves or castellations that are laser-machined on the IC carriers of the invention have straight, flat bottoms, each of which is parallel to its respective edge of the carrier and normal to the general plane of the carrier, and the flat groove bottoms are selectively coated with the metallization. The laser-machined slots to provide these flat-bottomed peripheral grooves or castellations have the surprising benefit of being much more efficient than prior art round holes in the vacuum drawing of metallization paste through the slots. Another surprising benefit of the flat-bottomed slots is that by limiting application of the metallization paste to only the flat bottoms, and exluding it from the curved ends of the slots, the metallization remains discretely located in the flat bottoms and is not drawn by capillarity or forces of the vacuum around the ends as it is inevitably drawn all of the way around circular holes used in the prior art. This leaves insulation ends in the slots, and hence at the ends of the peripheral grooves or castellations, so that each carrier is electrically completely isolated from all other carriers in the matrix, allowing the carriers to be tested in matrix or array form rather than having to be separated individually tested as were prior art carriers having semicircular peripheral grooves. These flat-bottomed grooves of the invention also enable use of flat leads or input/output terminals which may be brazed or soldered to the metallization in the bottoms of the grooves with a better mechanical and electrical connection than could be achieved between the prior art round leads and semicylindrical grooves. In a modified lead form, pairs of the flat leads are sandwiched together with a layer of insulation between them, and these may be connected in metallized extra-wide laser-cut slots between adjacent IC carriers where the carriers are left connected together in an array.

The IC carrier system of the present invention, including both the novel laser-machining method of making them and the resulting carriers themselves, is applicable not only to semiconductor IC chips but also to hybrid integrated circuits which are a recent development in the integrated circuit art.

BRIEF DESCRIPTION OF THE DRAWINGS

These and other objects and advantages of the present invention will become more apparant from the following detailed description taken in conjunction with the drawings, wherein:

FIG. 7 is a greatly enlarged top plan view, with a portion broken away, illustrating a completed IC chip carrier according to the invention.

FIG. 8 is a bottom plan view of the carrier shown in FIG. 7.

FIG. 9 is a further enlarged fragmentary vertical section taken on the line 9—9 in FIG. 7.

FIG. 10 is a top plan view of the IC chip carrier shown in FIGS. 7-9, with a semiconductor IC chip operatively connected thereto.

FIG. 11 is a top plan view similar to FIG. 7, with a portion broken away, showing a modified form of the IC chip carrier with a resistor circuit component thereon.

FIG. 12 is a fragmentary bottom plan view showing a further modified form of the IC carrier with a metallized common bus and a resistor circuit component thereon.

FIG. 22 is a greatly enlarged fragmentary vertical section similar to FIG. 9 but illustrating a form of the invention wherein the conductive traces and vias have a refractory metal conductor base such as molybdenum-manganese, tungsten, or a combination of these, with a gold or other noble metal outer conductive layer on the exposed portions of the refractory metal but not on that portion of the refractory metal which extends under a dielectric solder barrier strip.

FIG. 23 is a view similar to FIG. 22, except that the gold or other noble metal layer also extends under the dielectric solder barrier strip.

FIG. 24 is a view similar to FIG. 22, but with a nickel layer over the refractory layer in the vias and on the bottom side of the carrier.

FIG. 25 is a view similar to FIG. 24, but with the nickel layer covering the entire refractory layer; and FIG. 26 is a view similar to FIG. 25, but illustrating a form of the invention in which a very thin copper plating is first applied to all ceramic surfaces of a matrix of the carriers, and then layers of copper plating, nickel plating, and gold or other noble metal plating are added to this thin initial copper plating, and the initial thin copper plating is then etched off of those portions of the carrier bodies not covered with the other layers of plating.

DETAILED DESCRIPTION

Figure 1:
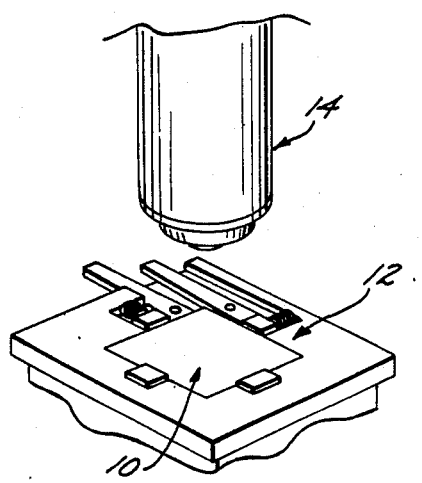
FIG. 1 is a fragmentary perspective view illustrating a sheet ceramic blank mounted on an X-Y work table with a laser delivery system operatively located above the blank.

Referring to the drawings, FIG. 1 shows a rectangular, preferably square, sheet ceramic blank 10 supported horizontally upon a work table 12 for laser machining or cutting according to the invention to produce a matrix of IC (integrated circuit) carrier bodies. The blank 10 is positioned with orthogonal edges thereof parallel to respective X and Y axes of the work table 12 and of the drive mechanism for a computer-driven laser delivery system generally designated 14. The laser beam is directed through delivery system 14 parallel to the Z or vertical axis, and the laser delivery system 14 is vertically adjustable to preselected positions on the Z axis and focusable at the sheet ceramic blank 10 in each of these preselected positions. Preferably a carbon dioxide laser generator is employed, for reasons described below, and since both the laser generator and the computer drive mechanism for the laser delivery system 14 are known in the art, they have not been illustrated herein.

The ceramic material of which the blank 10 is made is a high temperature ceramic, i.e., a ceramic material fired and sintered at a high temperature, preferably at least approximately 1550° C. Currently, there are two such high temperature ceramic materials available which have desired characteristics of high strength and stability after the primary firing, and high thermal dissipation and electrical resistance characteristics. These are alumina (aluminum oxide—$Al_2O_3$) and beryllia (beryllium oxide—$BeO$) in various purities such as 96 percent $Al_2O_3$, 99.5 percent $Al_2O_3$, the balance being glass, or 100 percent $Al_2O_3$, and generally greater than 99 percent BeO with the balance glass. Currently, IC chip carriers are made almost exclusively of alumina, but applicant has found that where relatively large amounts of power are generated by the electronics on a chip carrier, beryllia is much the preferred ceramic material in order to keep the junction temperature back of the chip low enough to avoid damage to electronic components or distortion of the electrical characteristics of the components. This is because beryllia has uniquely high thermal conductivity for a ceramic material, which is on the same order as the thermal conductivity of metal. Thus, beryllia will readily dissipate large amounts of power that may be generated on a chip carrier of the invention.

In order for a laser beam to be able to efficiently machine the high temperature ceramic material, it is essential that the beam have a wave length that will be substantially completely absorbable by the high temperature ceramic so that it can produce the intense localized amount of heat necessary to vaporize the ceramic material. This requires that the laser beam be in the middle infrared radiation range. A carbon dioxide laser beam has a radiation wave length of approximately 10.6 microns, which is directly within the middle infrared range, and therefore the laser generator employed in the present invention is preferably a carbon dioxide laser generator. By way of comparison, applicant has found that a YAG laser, which has a radiation wave length of approximately 1.06 micron, on the edge of the infrared range, is incapable of generating sufficient localized heat in the high temperature ceramic to perform applicant's laser machining according to the invention.

According to the invention, the blank 10 has been subjected to its primary firing and sintering prior to the laser machining or cutting, and prior to any metallizing thereon, so that its dimensions have become permanently fixed. Thus, when the slots and scribe marks are accurately laser-cut on the ceramic blank 10, this accuracy is not disturbed by later firing of the blank 10; and since the primary firing and sintering of the ceramic has already been done prior to any metallizing, and the secondary firing to fix the metallization is at substantially lower temperatures than the primary firing the accuracy of the metallization is maintained in the final product. Although the ceramic is a very hard material, it is readily machined or cut by the middle infrared laser beam, thus enabling the machining of the slots and scribe marks of the invention to be performed after the primary firing and sintering, instead of in the "green" stage as most of such cutting was done according to prior art methods.

Figure 3:
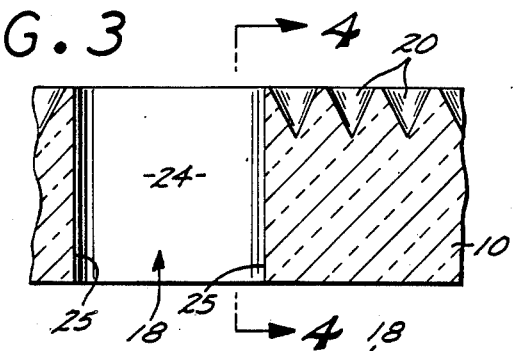
FIG. 3 is a greatly enlarged fragmentary vertical section taken on the line 3—3 in FIG. 2, illustrating the configurations of a slot and a series of scribe recesses that have been laser-machined in the sheet ceramic blank.
Figure 4:
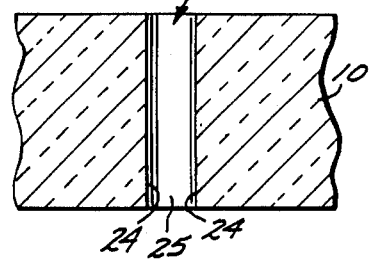
FIG. 4 is a fragmentary vertical section taken on the line 4—4 in FIG. 3.
Figure 2:
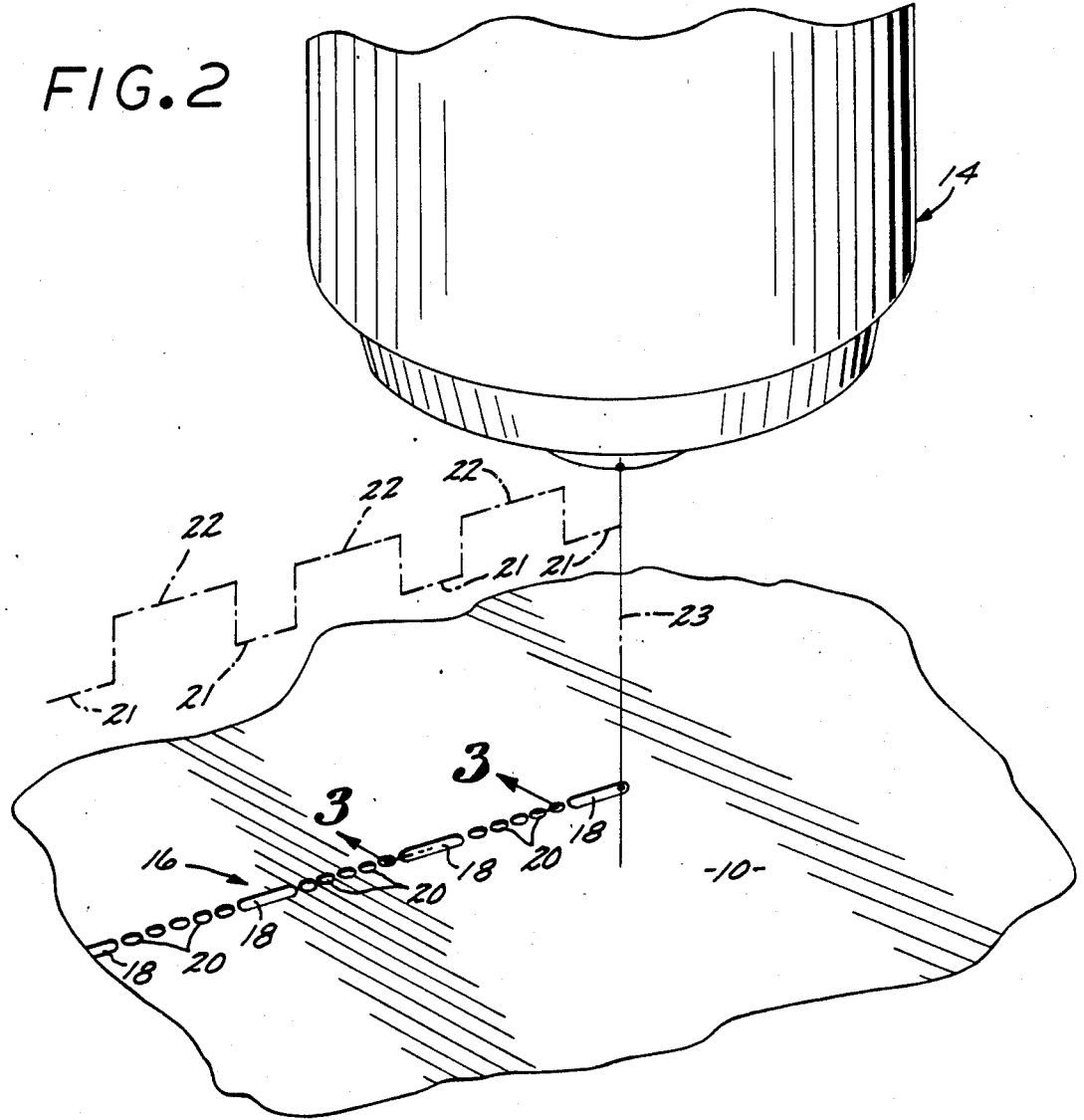
FIG. 2 is an enlarged fragmentary perspective view showing a portion of FIG. 1 and diagrammatically illustrating the laser machining of a sequence of slots and scribe recesses.

FIG. 2 diagrammatically illustrates the laser machining of a sequence 16 of slots 18 and scribe recesses 20 along a line parallel to the X axis of the system, and the greatly enlarged views of FIGS. 3 and 4 illustrate the configurations of the laser-cut slots 18 and scribe recesses 20. In FIG. 2, the laser delivery system 14, which delivers middle infrared laser pulses, is traveling from left to right delivering a series of overlapping pulses to produce each of the slots 18, and a series of separate, discrete pulses to produce each sequence of the scribe recesses 20. The laser delivery system 14 is adjustable vertically or on the Z axis and focusable at its various positions of vertical adjustment. Then, as the laser delivery system travels from left to right, it is shifted on the Z axis between a lowered vertical position represented by the phantom horizontal lines 21 in which the delivery system 14 is focused to machine the slots 18, and a raised vertical position represented by the phantom horizontal lines 22 in which the delivery system 14 is focused to machine the scribe recesses 20. The vertically directed laser beam is diagrammatically represented by the phanton line 23, and is at a location in FIG. 2 where one of the slots 18 has just been completed.

Although the laser beam 23 is a converging beam which narrows down to a diameter of approximately 0.005 to 0.007 inch at its focal point where it is cutting the slots 18 and scribe recesses 20, nevertheless with the use of air jets (not shown) directed proximate the focal point of the laser beam 23, and with the use of a vacuum cavity (not shown) in the work table 12 directly underneath the sheet blank 10, the slots 18 have generally straight, flat, parallel side walls 24 that are normal to the general plane of the blank 10, and semicylindrical end walls 25 that are also normal to the general plane of the blank 10. As seen in FIG. 3, the scribe recesses 20 have a conical configuration, and they extend preferably through from approximately ¼ to approximately ½ of the thickness of the ceramic blank 10 in order to provide clean break lines when the individual chip carrier bodies are broken away from the matrix thereof produced by the laser machining of the invention. The laser beam from delivery system 14 vaporizes the sintered ceramic, and the air jets blow out the resulting debris and plasma, with the vacuum chamber under the blank 10 drawing some of the debris and plasma on through the formed slots 18. Although it is to be understood that the present invention is not limited to any particular laser delivery apparatus, a suitable vertically adjustable and focusable laser delivery apparatus is Model 453R Focusing Delivery System with Z axis adjustability added available from Photon Sources, 37100 Plymouth Road, Livonia, Mich. 48150; this type of apparatus is available with associated air jets.

Applicant has greatly increased the efficiency of producing IC chip carrier matrices by the straight-line middle infrared laser machining of sequences 16 of alternating slots 18 and scribes 20, using the same laser and varying the Z axis position and focus to shift between the machining of the slots 18 and the machining of the scribe recesses 20. This sequential laser machining of the slots and scribes completely eliminates orbiting or other transverse movement of the laser, with associated stopping and reversing movements, required for the laser machining of the conventional round holes or other via hole configurations. Nevertheless, although it would be considerably less efficient, it is to be understood that if desired, all of the slots 18 may first be cut in one or more of the sequences 16 in a blank 10 and then all of the scribes 20 cut in such one or more sequences 16; or, conversely, all of the scribes 20 may first be cut in one or more of the sequences 16 in a blank 10 and then all of the slots 18 cut in such one or more sequences 16. It is also to be understood that for the preparation of some types of IC carriers, the adjacent ends of the successive slots 18 may be machined sufficiently close so that intervening scribes are not required for satisfactory break-off along a sequence of such slots 18.

Although the present invention is not limited to any specific dimensions, in order to best meet current standards in the art, with alumina used as the blank, it is presently preferred that the sheet blank 10 be a square approximately 4½ inches on each side, and be approximately 0.020 to 0.025 inch thick; that each of the slots 18 be approximately 0.020 inch in length and approximately 0.005 to 0.007 inch wide, with successive slots being spaced apart approximately 0.050 inch center-to-center. This leaves approximately 0.030 inch between the ends of adjacent slots, and along this length preferably five of the scribe recesses 20 are provided spaced apart approximately 0.006 inch center-to-center.

For the most popular ceramic sheet thicknesses of approximately 0.020 to 0.025 inch, applicant has found that scribe depths to the apices of the conical scribe recesses 20 of approximately 0.004 to 0.006 inch are sufficient to provide clean break lines, and depths in excess of 0.006 inch, although satisfactory, are unnecessary and may cause premature breakage during handling. For unusually thick parts, for example approximately 0.040 inch in thickness, scribe recesses 20 having depths of approximately 0.010 inch to their apices have been found sufficient to provide good, clean break lines. Thus, according to the invention, the scribe depths generally need be no greater than approximately ¼ to approximately ½ the thickness of the sheet ceramic blank 10.

Beryllia is more difficult to process to its primary fired, sintered condition in flat sheet form than is alumina according to current ceramic technology, and therefore IC chip carrier matrices of beryllia laser machined according to the present invention are generally smaller than those made of alumina, as for example on the order of about 2 inch by 2 inch squares.

Figure 16:
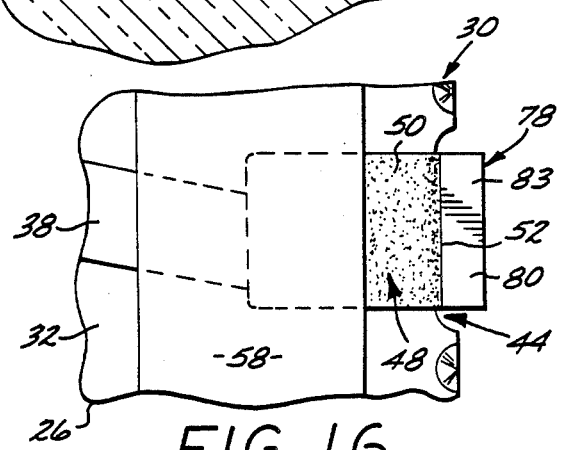
FIG. 16 is a top plan view showing the lead attached to the carrier.
Figure 17:
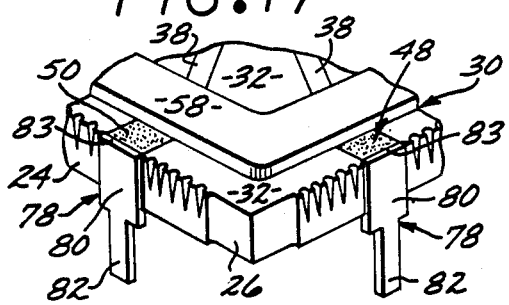
FIG. 17 is a fragmentary top perspective view showing a pair of the leads attached to the carrier.
Figure 19:
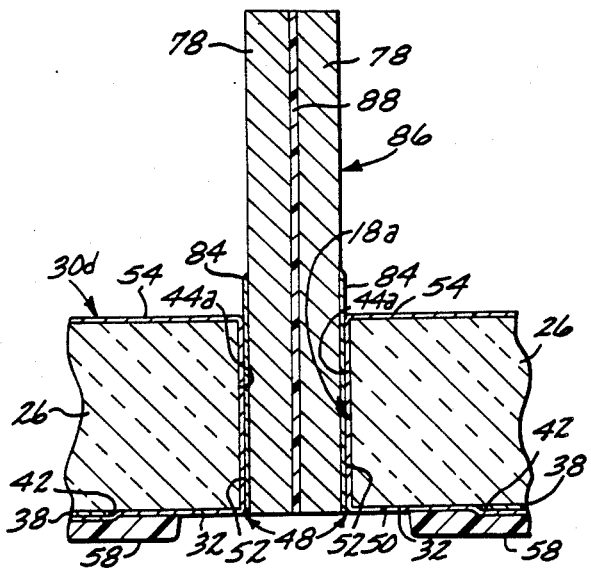
FIG. 19 is a greatly enlarged vertical section taken on the line 19—19 in FIG. 18.
Figure 18:
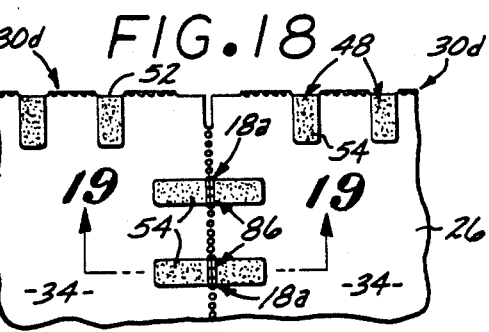
FIG. 18 is a bottom plan view showing two of the paired, sandwiched leads of the invention engaged in extra-wide slots between a pair of the carriers that remain interconnected in an array.

The approximately 0.005 to 0.007 inch width for the slots 18 is the presently preferred slot width for IC carriers that are adapted to employ single flat leads or pin terminals of the type shown in FIGS. 13-17. However, where sandwiched pairs of flat leads or pin terminals are to be employed between IC carrier bodies that are left attached together after they have been produced according to the invention, as shown in FIGS. 18 and 19, then the presently preferred width for the slots 18 is approximately 0.015 inch.

Figure 5:
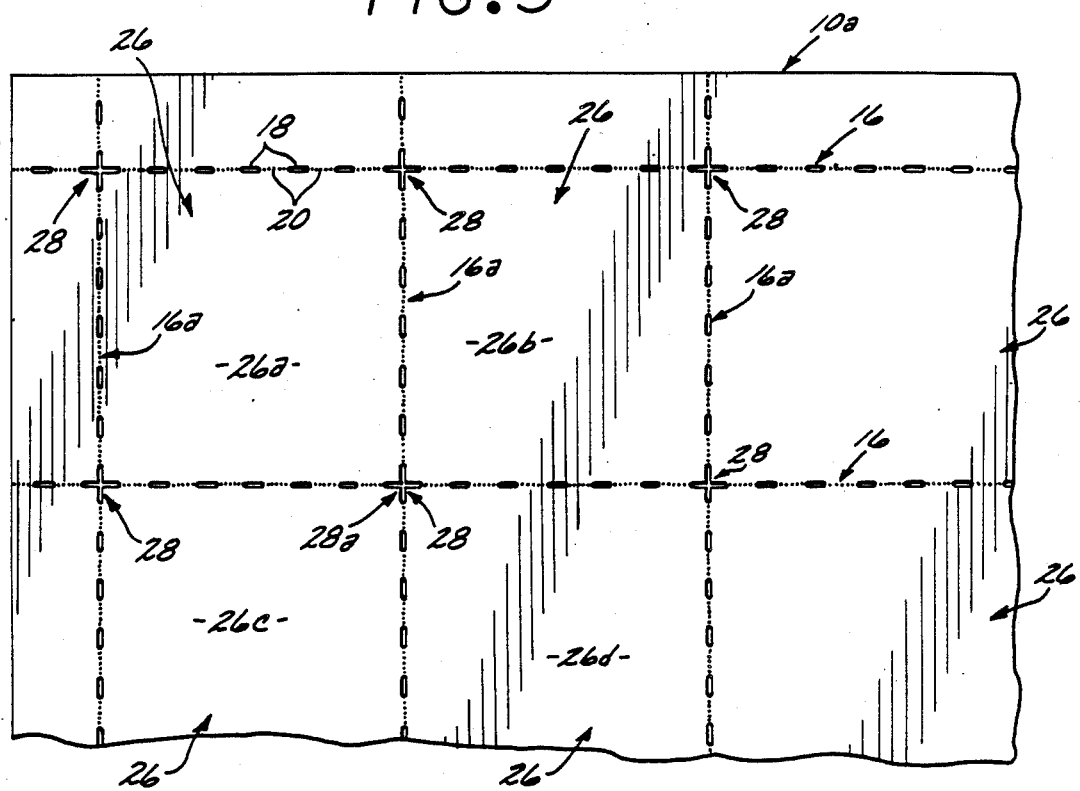
FIG. 5 is a greatly enlarged fragmentary plan view showing a matrix of interconnected IC carrier bodies that has been laser-cut along X and Y axes according to the procedure illustrated in FIG. 2.
Figure 6:
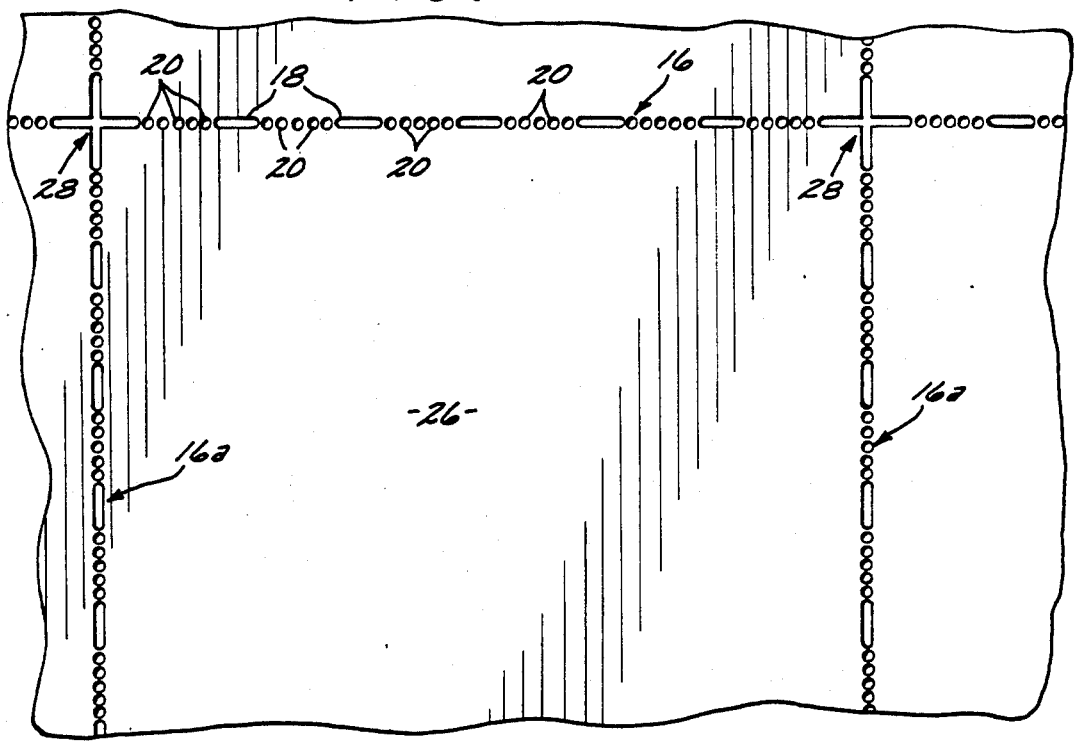
FIG. 6 is a further enlarged fragmentary plan view showing a portion of FIG. 5.
Figure 13:
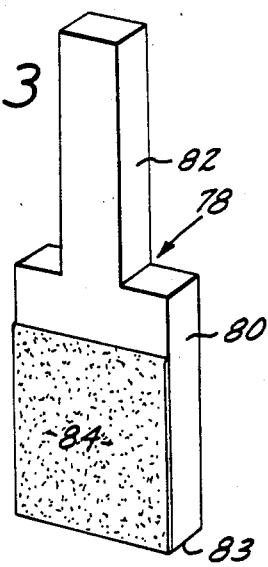
FIG. 13 is a greatly enlarged perspective view showing one of the flat leads of the invention inverted.

Referring now to FIGS. 5 and 6, a matrix of interconnected IC carrier or package bodies generally designated 10a is made by laser-cutting parallel, normally regularly spaced sequences 16 of the slots 18 and scribe recesses 20 all of the way across the ceramic blank 10 parallel to the X axis, and laser-cutting parallel, regularly spaced sequences 16a of the slots 18 and scribe recesses 20 all of the way across the blank 10 parallel to the Y axis. The resulting individual IC carrier or package bodies are generally designated 26, and these are preferably made square so that the conductive traces that are applied after the bodies 26 have thus been laser-cut will be as uniform as possible and of minimum lengths. It is to be understood, however, that the individual carrier bodies 26 may be of other rectangular configurations.

Although the fired, sintered sheet ceramic blank 10 may be of any desired rectangular configuration and dimensions, and any desired number of the individual IC carrier bodies 26 may be laser-cut thereon, a typical alumina blank 10 will be approximately 4½ inches by 4½ inches as indicated above, which can be laser-cut into four 2 inch by 2 inch matrices 10a, each of which has, for example, twenty-five square IC carrier or package bodies 26 laser-cut thereon. The individual IC carrier bodies 26 may be made in any size according to the number of input/output terminals each is to have, the number of terminals ranging from a minimum of four all of the way to eighty or even more. By way of example and not of limitation, the IC carrier bodies 26 that are shown in the accompanying drawings are each adapted for twenty input/output terminals that are each associated with a flat side wall 24 of each of five discrete slots 18 along each of the four edges of the body 26.

At each intersection of the X and Y sequences 16 and 16a, respectively, of slots 28 and scribe recesses 20, there is an "X" 28 of intersecting slots 18. As described below in connection with FIGS. 7–10, only one, if any, of the four corners of each carrier body 26 need be metallized for a base connection. Thus, to provide this single metallized corner on each of four individual IC carrier bodies 26 in a square array of bodies 26a, 26b, 26c and 26d, only the single "X" 28a of intersecting slots 18 need be metallized. It is to be understood, however, that any of the slots, when metallized, may be used as part of a base or other connection.

All of the metal applied to the IC carrier bodies 26 is applied and fired into position while the full matrix 10a of bodies 26 is connected together; and with the above-described laser machining or cutting being performed on a ceramic blank 10 that has previously received its primary firing and sintering, all of the metal application, including all of the metal pads, traces and other conductors, can, by means of any conventional thick film deposition process, or in some instances by means of plating, be extremely accurately located relative to the peripheries of the individual carrier bodies 26, and in particular relative to the locations of the slots 28, including the corner slot "X's" 28. Although the metals are preferably applied by thick film deposition, or in some instances by plating, it is to be understood that in some cases some of the metal may be applied by a thin film process. When the metal is applied by a thick film deposition process, after the metal is applied, it is fixed into position by secondary firing while all of the carrier bodies 26 are still interconnected in the full matrix 10a. Then, the straight-line sequences 16 and 16a of slots 18 and scribe recesses 20 parallel to the respective X and Y axes enable the IC carrier bodies to be broken off from the matrix 10a either individually or in any desired arrays.

Because the present invention thus enables both the structures of the carrier bodies 26 and the metal conductors thereon to be provided to very exact tolerances, automatic die and wire attachment equipment can be employed for very rapid die or chip attachment and wire connection with the carrier bodies 26 still interconnected in the full matrix 10a thereof, or with any array of some of the carrier bodies 26 still interconnected to each other but broken off from the full matrix 10a, or with the IC carrier bodies 26 separated from each other.

Such exact tolerances also enable the IC carrier bodies 26, with or without attached dies and other circuit components, to be tested in array form, either in the full matrix 10a or in any still-connected array of the carrier bodies 26 broken off from the matrix 10a. Such array testing is permitted for the first time in the art without isolating each chip carrier with completely unmetallized ceramic borders not only because of the exact tolerances achieved by the present invention, but also because the novel flat-sided slots 18 of the laser-machined slot/scribe sequences enable selective metal deposition only on the flats of the slots 18 and not on the curved ends of the slots 18, whereby each individual carrier body 16 is completely electrically isolated from all other carrier bodies 26 in an array, as described more in detail hereinafter.

FIGS. 7, 8 and 9 illustrate an IC carrier generally designated 30 which is based upon one of the bodies 26 broken off from the machined alumina sheet matrix 10a of FIGS. 5 and 6, and which has been completed except for the attachment of leads or pin terminals. On the finished carrier 30, the body 26 has flat top and bottom surfaces 32 and 34, respectively. The finished IC carrier 30 shown in FIGS. 7-9 is of the type adapted to support and provide input and output conductors for a silicon integrated circuit chip, and it has a die (i.e., chip) pad 36, which, when used, is usually but not always square, centered on its top surface 32, with twenty conductive traces 38 also on top surface 32, the traces 38 commencing at inner ends 40 that are spaced from the pad 36 and radiate outwardly to outer ends 42 (see FIG. 9) that are located inwardly from the four edges of the square carrier body 26. The outer ends 42 of conductive traces 38 each are located adjacent to and directly inwardly from a respective elongated, straight, flat groove 44 on one of the four edges of the body 26, each of these grooves 44 being defined by one-half of a laser-cut slot 18. The carrier body 26 has five of these grooves or castellations 44 which may be regularly spaced along each of its four edges (not counting the corner grooves formed by the "X's" 28 of intersecting slots 18 at the four corners). Thus, there is a total of twenty of the grooves 44 spaced about the periphery of the carrier body 26, and there may accordingly also be twenty of the conductive traces 38 which extend outwardly from adjacent the die pad 36 to locations adjacent the respective grooves 44 where all of the grooves 44 are employed as conductive vias as described below. However, only a portion of the grooves 44 may be employed as conductive vias if desired, and in that case, a corresponding lesser number of the conductive traces 38 will be provided.

In addition to the conductive traces 38, there is a pad conductor trace 46 which electrically connects the die pad 36 (when used) to one of the four corners of the IC chip carrier 30. This conductive trace 46 is a base conductor for the die or chip that is to be attached to the pad 36. Alternatively, the die pad may be connected to any of the conductive traces 38.

Several alternative metallization application techniques or methods may be utilized according to the invention. A first metallization application method is to screen-print metallization paste directly onto surfaces of the carrier bodies 26 attached in the matrix 10a thereof, and then fire the matrix at a relatively low temperature such as approximately 850°-900° C. to drive off binders of the film and sinter the metallization together and fix it onto the ceramic surfaces. A second metallization application method according to the invention is to first deposit a refractory metal such as molybdenum-manganese, tungsten, or a combination of these, using a conventional film deposition process, and then fire the matrix 10a at a relatively high temperature such as approximately 1400° C., which is still considerably below the primary ceramic firing temperature of approximately 1550° C. or higher, to drive off film binders and sinter and fix the refractory metal to the ceramic; and then to electroless plate gold or other noble metal onto the refractory metal and fuse and fix the gold or other noble metal with a relatively low temperature firing such as at approximately 950°-1000° C. This second metallization application method may also include an intermediate nickel plating between at least a portion of the refractory metal and the gold or other noble metal as a solder barrier. A third alternative method of applying the metallization to the matrix 10a of carrier bodies 26 employs an initial overall very thin copper electroless plating on the ceramic, which then permits a sequence of platings with photolithographic patterning, preferably of more copper, then nickel, and then gold or other noble metal, with a final etching off of the initial thin copper coating from the unpatterned areas of the ceramic, leaving the desired conductive traces. A fourth, "thin film" alternative method of applying the metallization to the matrix 10a of carrier bodies 26 employs an initial overall very thin sputtered film of titanium-tungsten on the ceramic, an overall thin sputtered film of copper over the titanium-tungsten film, and then a sequence of electroylytic platings applied with photolithographic patterning, preferably of more copper, then nickel, and then gold or other noble metal, with a final chemical etching off of the two sputtered films from the unpatterned areas of the ceramic. The third and fourth metallization application methods have the advantage of eliminating the necessity for all firings other than the initial primary high temperature firing to stabilize the geometry of the ceramic.

The first of these three alternative metallization application methods or techniques will now be described.

The die pad 36, input/output conductive traces 38, and pad conductor trace 46 are conventionally made of gold and may be applied to the top surfaces 32 of the carrier bodies 26 in the matrix 10a with a thick film deposition screen printing technique that is known to those skilled in the art. The thick film gold is screened onto the top surfaces 32 in particulate form with suitable resin binders, and then the gold is sintered together and fixed onto the surfaces 32, with the binders being vaporized off, by a secondary, relatively low temperature firing of the matrix 10a in the range of approximately 850°-900° C. which will not in any way disturb the size or configuration of the previously high temperature-fired ceramic matrix 10a. Alternative noble metal alloys that may be employed in lieu of gold are an alloy of palladium and silver, an alloy of platinum, palladium and silver, an alloy or platinum and gold, an alloy of palladium and gold, or an alloy of platinum and silver. Also, quite recently, copper has been used. All of these metals may be applied in the same manner as the gold, preferably by a thick film deposition process, and fired to fix the metal. The noble metals, including the gold or the alternative noble metal alloys, may be fired in air; whereas if copper is employed, it should be fired in an inert atmosphere.

After the die pad 36 and conductive traces 38 and 46 have thus been applied to the top surface 32 of each body 26 in the matrix 10a, metallization conductors generally designated 48 are applied. These metallization conductors are preferably composed of one or more of the above-listed alternative noble metal alloys, or of copper, and are also preferably applied by a thick film deposition process, and the matrix 10a is again fired in a secondary or relatively low temperature firing in the range of between approximately 850°-900° C. so as to sinter the metallization which was particulate when applied, fix the metallization onto the carrier bodies 26 where it was applied, and vaporize off the resin binders with which it was applied. Although the die pads 36 and their associated conductive traces 38 and 46 are usually applied to the carrier bodies 26 and fired before the conductors 48, it is to be understood that the order of these applications may be reversed.

The metallization conductors 48 constitute input/output conductors for an IC chip that is to be mounted on the die pad 36, and for the IC chip carrier 30 illustrated which has an array of twenty of the conductive traces 38, there will be a corresponding number of the metallization conductors 48 associated with the respective conductive traces 38.

Each of the metallization conductors 48 includes a portion 50 on the top of chip carrier 30 which overlies (but would underlie if the order of application of the metals were reversed) and electrically connects with the outer end portion of a respective conductive trace 38 and extends outwardly along the top surface 32 of carrier body 26 to a respective one of the elongated, flat grooves 44 in body 26. Then each of the metallization conductors 48 extends downwardly in a portion 52 within the respective groove 44 from top surface 32 to bottom surface 34 of body 26, preferably filling most of the length of the straight, flat bottom of the groove 44, but stopping short of the arcuate ends of the groove. The metallized grooves 44 are sometimes referred to in the art as "via's," as they provide electrical conduction from the top of the bottom of the carrier. Each of the metallization conductors 48 then extends downwardly out of the respective groove 44 to a bottom portion 54 which is fixed to the bottom surface 34 of body 26 as seen in FIGS. 8 and 9. These bottom portions 54 of the metallization conductors 48 constitute external contact pads that may, if desired, be soldered directly onto a printed circuit board. As an alternative to such direct soldering of these external contact pad portions 54 of the finished IC chip carrier onto a printed circuit board, flat leads or pin contacts may be brazed or soldered to the flat portions 52 of metallization conductors 48 located in the grooves 44, as shown in FIGS. 13-19 and described in detail in connection therewith; such leads extending downwardly below the bottom of the IC chip carrier 30 and their free ends being adapted to be soldered to a printed circuit board with the IC chip carrier 30 raised above the board. One of the metallization conductors 48 terminates on the bottom surface 34 in an identification or marker pad 55 that is longer than the other external contact pads 54.

The one corner of the IC chip carrier 30 designated 56 in FIGS. 7-9 includes one-quarter of the corner slot "X" 28a referred to in connection with FIG. 5, and this corner 56 of chip carrier 30 is metallized on top surface 32, bottom surface 34 and on the edge surfaces defined by the intersecting slots 28a. The metallization on the top surface 32 of corner 56 overlies and electrically connects with the pad conductor trace 46, so that together the pad conductor trace 46 and the metallized corner 56 constitute the base connection for the semiconductor chip that will be mounted on the die pad 36.

When the metallization is applied to the carrier body 26, preferably by a thick film procedure, it is in the form of a viscous paste or "ink" that is applied to all of the carrier bodies 26 in the still-intact matrix 10a of FIGS. 5 and 6, being applied right over the slots 18 and the corner slot "X's" 28a, and vacuum-drawn through the slots 18 and corner slot "X's" 28a for application of the metallization in its portions 52 in slot grooves 44 and on the edge surfaces of the corner 56.

In addition to the advantages of the elongated slots 18 already discussed, including the ability to sequentially laser-machine such slots 18 and intermediate scribes 20, and the ability to attach flat leads or pin contacts to the flat metallization conductor portions 52 in the slots 18, there are further unexpected and surprising advantages of these elongated slots 18. One such advantage is that this shape is much more efficient for the vacuum drawing of metallization through the slots than the vacuum drawing of metallization through the conventional round holes. This is because there is minimal cross-sectional area of the slots 18 relative to the long flat surface areas 24 of the bottoms of the slots which are being metallized, due to the relative closeness of the opposing flat slot bottoms 24 of adjacent carrier bodies 26. Thus, very little of the vacuum is wasted proximate the longitudinal centers of the slots 18. To the contrary, with conventional round holes, there is a maximum of open cross-sectional space relative to the annular surface to be metallized, with a consequent large wasting of vacuum energy.

Another unexpected and surprising advantage of the elongated slots 18 is that the metallization does not tend to creep by capillary action or under the forces of the vacuum drawing when the metallization is restricted to flat surface areas 24 of the slots 18. Thus, by limiting the metallization to the flat bottom surfaces 24 of the slots 18, and keeping the metallization from contacting any portions of the arcuate ends 25 of the slots 18, the metallization portions 52 will remain confined to the flat surface portions 24 of slots 18. This leaves the arcuate ends 25 of the slots 18 with full electrical insulating characteristics such that all of the chip carriers 30 of a complete matrix 10a to which the metallization has been applied are completely electrically isolated from each other, permitting the electrical testing of the carriers 30 while still in the array form, which is a great deal more efficient than having to test each carrier individually as was required in the prior art. Metallization could not be applied selectively to only portions of the prior art round holes, because the curvature of the holes caused the metallization to creep by capillarity and/or the vacuum forces all of the way around the holes; and this in turn required the carriers made by this prior art procedure to be separated from the matrix prior to testing, and then individually tested.

Usually the metallization conductors are applied in two stages. First, the metallizing paste is applied to the top surfaces 32 of the bodies 26 and over the tops of the slots 28, drawn partly down through the slots 28, dried and fired; then the metallizing paste is applied to the bottom surfaces 34 of bodies 26 and over the bottoms of the slots 28, drawn partly up through the slots 18, dried and fired. However, for more complex carriers, the metallization may be applied in three stages. First, the metallizing paste is drawn all of the way through the slots 18 and is dried and fired; second, the metallizing paste is applied to the top surfaces 32 of bodies 26, dried and fired; and third, the metallizing paste is applied to the bottom surfaces 34 of bodies 26, dried and fired. All of such firing to fix the metallization is low temperature firing at temperatures in the range of approximately 850°–900° C.

The metallization conductors 48 and corner 56, and also the die pad 36 and conductive traces 38 and 46, will normally have a thickness on the order of about 0.0005 inch.

Because the present invention enables the primary, high-temperature firing for sintering the sheet ceramic blank 10 to be done prior to the metallizing, instead of having to do the metallizing in the "green" stage of the alumina blank before such primary firing as was necessary in the prior art, and the only firing that is required according to the invention to fix the metallization is a secondary firing at a temperature substantially lower than the initial primary firing, the invention enables a conventional metallization such as platinum/palladium/silver alloy to be utilized which has excellent electrical conductivity and solderability characteristics.

A dielectric seal ring 58 is applied to each carrier body 26 in the matrix 10a after the metallization has been applied and fixed. This seal ring 58 is generally peripherally located on the top surface 32 of IC carrier 30 and overlies the overlapped portions of the conductive traces 38 and the top metallization portions 50. The seal ring 58 serves as a solder barrier to prevent solder that may be applied to the metallization from running to the gold or other metal of the conductive traces 38 and 46. The dielectric of the seal ring 58 is a screen printable, firable dielectric material such as 1017 RCU obtainable from Thick Film Systems, Inc. of Santa Barbara, Calif.

The customer of the IC carrier 30 will apply a lid after the IC has been attached and its wires connected. A lid of metal, ceramic or plastic can be epoxied directly to the dielectric seal ring 58. Alternatively, a lid of metal or metallized ceramic may be soldered to the seal ring 58 by first screening a layer of solderable metallization such as platinum/palladium/silver or platinum/gold onto the seal ring 58, drying, and low temperature firing (at approximately 850° C. for example) such metallization.

An alternative to the dielectric seal ring 58 and the epoxy and solder lid attachments thereto described above is to provide a glass seal ring 58 and a glass connection thereof to a metal or ceramic lid. In such case, one or more layers of sealing glass are screen-printed onto the top surface 32 of each carrier 30 in the matrix or onto a previously deposited dielectric seal ring, dried between layers, and low temperature fired at approximately 400° C. The lid to be attached also has sealing glass thereon, and the attachment is effected by putting the glass of the lid and seal ring together and firing to a sealing temperature of approximately 400° C.

FIG. 10 illustrates a finished IC chip carrier 30a like the carrier 30 of FIGS. 7-9 but with a semiconductor IC chip operatively connected thereto. The IC chip 60 has its silicon base attached to the die pad 36 by conventional means such as conductive epoxy, an alloy of gold and tin, or an alloy of gold and silicon. The input/output wires 62 of chip 60 are welded to selected conductive traces 38 of the carrier 30a proximate the inner ends 40 of these traces 38. The chip wires 62 are conventionally made of gold or aluminum.

FIG. 11 illustrates an IC chip carrier generally designated 30b which has the same construction as the carrier 30 of FIGS. 7-9 except for the addition of a circuit component on the upper surface 32 of carrier 30b and variation in the configurations of several of the conductive traces to make room for this circuit component. The circuit component embodied on the chip carrier 30b is a resistor 66 that is electrically connected between an input conductive trace 68 and a ground or common bus conductive trace 70 as, for example, a barrier to static surges that might otherwise be imposed upon an IC chip mounted on the die pad 36. The traces 68 and 70 between which resistor 66 is connected have been provided with jogged sections which change the layout on top surface 32 to provide an open area for the resistor 66.

Although only a single resistor 66 has been shown in FIG. 11, it is to be understood that any number of resistors may be provided on the top surface 32 of the IC chip carrier 30b; and it is also to be understood that one or more of any other desired type of circuit component of suitably small dimensions such as a capacitor, moisture sensor or the like, may be secured to the top surface 32 of carrier 30b and electrically connected to any two or more of the traces 38, 68, 70 or traces that may be otherwise configured.

Such circuit components are applied to the top surface 32 after the metallization conductors 48 have been applied and fixed by low temperature firing. To provide a resistor like the resistor 66, the resistor material with suitable resin binders will be screen-printed directly onto the surface 32 and fixed by another low temperature firing which vaporizes off the binders. Then, the resistor 66 may be laser-trimmed to an exact ohmic value.

As discussed above, a YAG laser is on the edge of the infrared range, having a considerably shorter radiation wave length of approximately 1.06 micron, which makes the YAG laser ineffective for penetrating the high temperature ceramic employed in the invention. Advantage is taken of this characteristic of the YAG laser by using a YAG laser to perform the laser-trimming of circuit components such as the resistor 66 on IC chip carriers made according to the present invention. The resistor 66 and other circuit components to be trimmed are preferably made with metal particles that sinter together during the secondary firing so as to readily absorb the YAG laser radiation, being heated and vaporized thereby for the trimming process. At the same time, the underlying high temperature ceramic base of the invention is substantially completely unaffected by the YAG laser trimming so that it is not in any way damaged. After the trimming a protective overglaze may then be applied to protect the resistor material from the environment.

FIG. 12 is a fragmentary bottom plan view of a further IC chip carrier designated 30c which has features added to the bottom surface 34 thereof but which may otherwise be structurally the same as the IC chip carrier 30 of FIGS. 7-9 or the IC chip carrier 30b of FIG. 11. The carrier 30c of FIG. 12 has a square area 72 of the metallizing metal centrally located on the bottom surface 34 to serve as a common bus. The common bus 72 is directly electrically connected from a corner thereof through a metallization conductor 74 to the metallized corner 56 which, in turn, is electrically connected on the top surface 32 of the carrier 30c through the pad conductor trace 46 to die pad 36. Alternatively or additionally, the common bus metallization area 72 may be directly electrically connected by one or more metalization conductors (not shown) on bottom surface 34 to a respective one or more of the metallization pads 54 or to the metallization identification or marker pad 55.

As an illustration of a use for the common bus metallization area 72, a resistor element 76 applied to the bottom surface 34 bridges between the common bus 72 and one of the metallization pads 54. This resistor element 76 may be for the same purpose as the resistor 66 of FIG. 11, namely, to avoid static surges, or serve as a termination resistor for certain types of digital electronic IC's, and it is applied, trimmed to value with a YAG laser, and provided with a protective overglaze in the same manner as described above for the resistor element 66.

Referring now to FIGS. 13-17, leads or input/output terminals are shown which have a flat configuration that is better enabled to be used by the elongated, straight, flat via portions 52 of the metallization conductors 48 located in the elongated, laser-cut peripheral grooves 44 in the IC carrier 30. The use of leads 78 enables an IC carrier 30 to be supported spaced above a circuit board, primarily for the purpose of taking up the difference between the coefficient of expansion of the ceramic IC carrier and a printed circuit board which will conventionally be a laminate of glass and epoxy.

The primary advantage of the flat leads 78 over the conventional round leads is that an increased amount of contact area is provided between the leads 78 and the flat metallization portions 52 in the grooves 44. Also, the flat opposing surfaces on the leads 78 and the metallization portions 52 assure that there will be a full surface bond therebetween without there being any critical thickness of the layer of braze material or solder; whereas with the concentric semicylindrical opposing surfaces where round leads are used, there is a very critical thickness of the layer of braze material or solder if a full surface bond is to be achieved. A further advantage of the flat leads 78 is that they can be stamped with braze or solder material already applied for economy of manufacture.

Each of the leads or IO's (input/output terminals) 78 includes a wide, flat, rectangular body portion 80 and a narrower elongated, flat pin portion 82 projecting coaxially from the body portion 80. One of the leads 78 is shown, inverted for clarity of illustration, by itself in FIG. 13, spaced from an IC carrier 30 but oriented in preparation for attachment in FIG. 14, and attached to the carrier 30 in FIG. 15. In the top view of FIG. 16 and perspective view of FIG. 17, the leads 78 are illustrated uninverted.

The bodies 80 of leads 78 preferably have substantially the same widths as the lengths of the flats of the grooves 44 and corresponding lengths of the metallization portions 52 in the grooves 44 in the horizontal direction (i.e., in the direction of the general plane of the carrier 30). The lead bodies 80 are preferably somewhat longer in the vertical direction than they are in width, so that when the leads 78 are attached with the top edges 83 at substantially the same level as the top surface of carrier 30 as shown in FIG. 17, lower portions of the lead bodies 80 will project downwardly below the bottom surface 34 of carrier 30 to provide stand-off spacing above a circuit board. A layer of braze or solder material 84 is provided on one side of the body 80, extending horizontally across the entire width of body 70 and having a vertical extent from the top edge 83 that is approximately the same as the vertical extent of the grooves 44 and the metallization portions 52 therein, which corresponds approximately to the thickness of the carrier 30 between its top and bottom surfaces 32 and 34, respectively. For the dimensions given by way of example hereinabove, with the horizontal length of the grooves 44 and the thickness of the carrier 30 and corresponding vertical dimensions of the grooves 44 both being approximately 0.020 inch, the metallization portions 52 in the grooves 44 will be flat, square areas approximately 0.020 by 0.020 inch, and the areas 84 of braze or solder material on the lead bodies 80 will have matching dimensions of approximately 0.020 inch by 0.020 inch, the lead bodies 80 being approximately 0.020 inch wide. The leads 78 have a presently preferred thickness of approximately 0.005 inch, which gives them adequate structural strength and is compatible with conventional printed circuit board circuitry.

Figure 14:
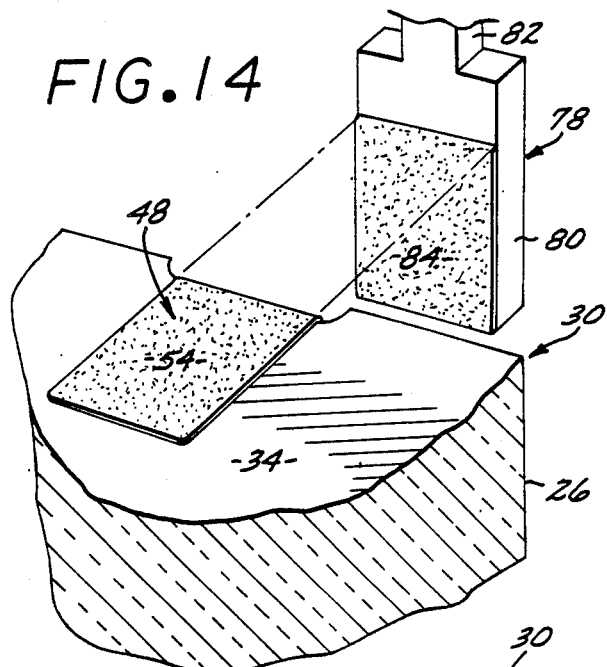
FIG. 14 is a fragmentary bottom perspective view showing the lead of FIG. 13 oriented in preparation for attachment to an IC carrier of the invention.
Figure 15:
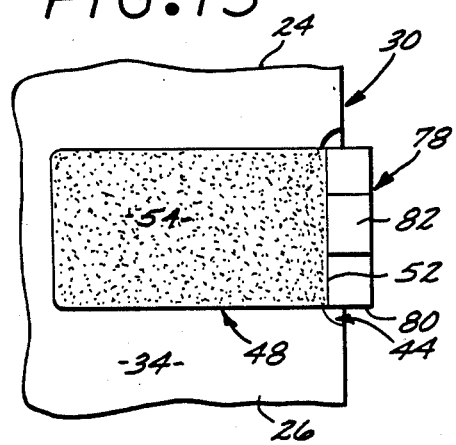
FIG. 15 is a fragmentary bottom plan view showing the lead attached to the carrier.

All of the leads that are desired to be attached to a particular IC carrier 30 are positioned as indicated in FIGS. 14, 15 and 16 with their areas 84 of braze or solder material in registry with the respective metallization portions 52 and the leads brazed or soldered into mechanical and electrical connection with the metallization portions 52 by automated equipment known in the art that is adaptable for handling the flat leads 78.

Referring to FIGS. 18 and 19, the flat configuration of the leads or IO's 78 enables them to be conveniently provided in a double, sandwich form generally designated 86 which is useful in the situation where a plurality of the IC carriers are left connected together in an array. Portions of two of these carriers are illustrated in FIGS. 18 and 19, with the carriers 30d shown inverted for clarity of illustration. To accommodate the thickness of the double lead sandwich 86, the slots 18a are laser-machined to extra width, as for example approximately 0.015 inch, which makes the corresponding opposed grooves 44a of each slot 18a extra deep, as for example approximately 0.0075 inch.

The two leads 78 are arranged in face-to-face registry and are separated by a layer 88 of insulation material which electrically isolates each of the leads 78 from the other. The areas 84 of braze or solder material face outwardly on both of the leads 78, and the body end portions 80 of the sandwiched leads 78 are inserted into a slot 18a as seen in FIG. 19, and each lead 78 is then brazed or soldered to a respective metallization portion 52 of the respective IC carrier 30d. It is to be noted that the insulation material of layer 88 is of such character as to withstand the brazing or soldering temperature.

Figure 20:
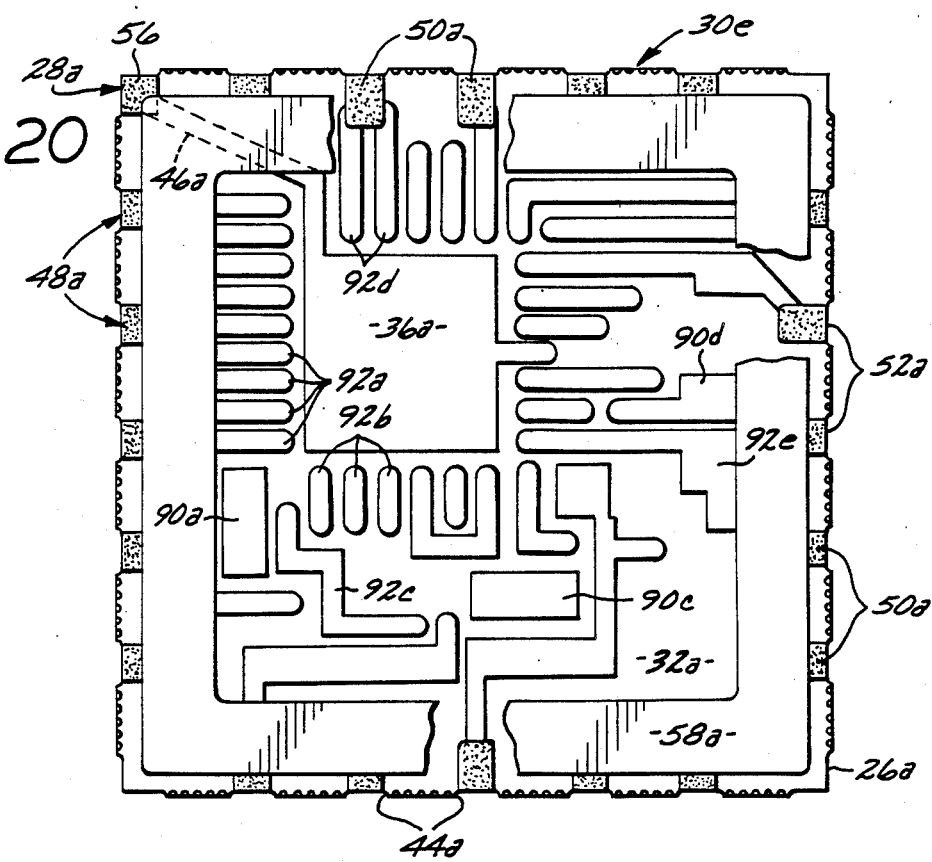
FIG. 20 is a greatly enlarged top plan view, with a portion broken away, of an IC carrier according to the invention with conductive pads and traces diagrammatically illustrated thereon adapted to become a hybrid integrated circuit.
Figure 21:
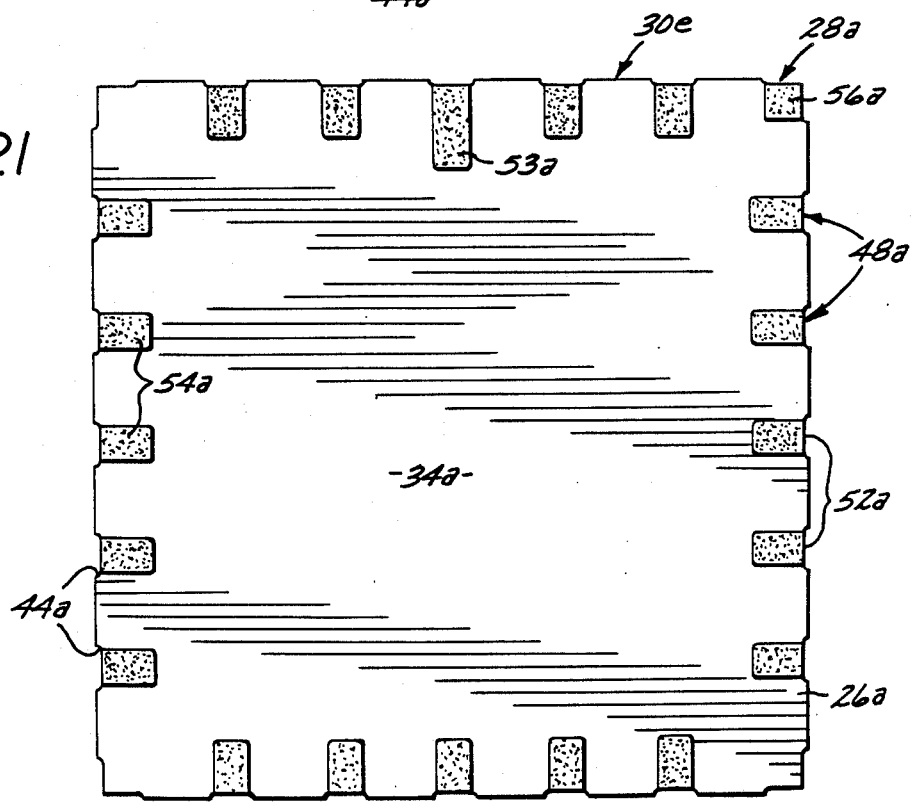
FIG. 21 is a bottom plan view of the hybrid IC carrier of FIG. 20.

FIGS. 20 and 21 illustrate the IC carrier system of the present invention applied in the form of a hybrid integrated circuit, which is a recent development in the integrated circuit art. Thus, in FIGS. 30 and 21, 30e designates a hybrid IC carrier as distinguished from the discrete IC chip carriers 30 of FIGS. 7-9, 30a of FIG. 10, 30b of FIG. 11, and 30c of FIG. 12.

The hybrid IC carrier 30e is manufactured with the same series of steps as described hereinabove in detail for the IC chip carrier 30 of FIGS. 7-9, the only difference being in the more complex layout of the conductive traces of gold or other metal corresponding to the traces 38 and 46 of FIGS. 7-9. Thus, the hybrid IC carrier 30e includes sintered ceramic body 26a preferably of alumina or beryllia, having top and bottom surfaces 32a and 34a with laser-cut peripheral grooves 44a. A square die pad 36a of gold or other suitable metal lies on the top surface 32a, but in this case may not be centered. At the same time the die pad 36a is applied, additional pads such as pads 90a, 90b, 90c and 90d are applied generally of the same metal to accommodate various circuit components, and a variety of conductive traces generally of the same metal are applied, such as traces 92a, 82b, 92c and 92d. The die pad 36a is adapted to receive a semiconductor integrated circuit like the IC chip 60 of FIG. 10, while the other pads 90a, b, c and d are adapted to receive such other circuit components as resistors, capacitors, transistors, diodes, dielectric components, other metal components, and the like. The pads 36a and 90a–d and the conductive traces 92a–d are preferably applied by a thick film process, and fixed by low temperature firing.

In producing the hybrid IC carriers 30e, usually the aforesaid pads and traces are applied and fixed after the metallization input/output conductors have been applied and fixed, which is the reverse of the usual order of application for the IC chip carriers 30.

Still referring to the first of the three metallization methods or techniques summarized above, metallization input/output conductors 48a are applied, as well as the corner 56a being metallized, when required, preferably by a thick film process, and the metallization is fixed by low temperature firing. The metallization conductors 48a may be the same as the conductors 48 of FIGS. 7-9, including top surface portions 50a, groove or via portions 52a, and bottom surface pad portions 54a. Conductor trace 46a may connect the IC chip pad to the metallized corner 56a as a base connection for the IC chip that will be applied to pad 36a. The conductive traces such as 46a and 92d which extend peripherally outwardly into contact with metallization conductors are protected from flowing solder by dielectric or glass seal ring 58a.

It is to be understood that the layout of conductive pads 36a and 90a–d, and of the various conductive traces including 46a, 92a–d, and others, are diagrammatic to illustrate application of the present invention to a hybrid type of integrated circuit, and are not intended for any particular hybrid integrated circuit. It is also to be understood that although input/output leads have not been shown in FIGS. 20 and 21, leads like the leads 78 shown in FIGS. 13-17 and 86 shown in FIGS. 18 and 19 may be employed with hybrid integrated circuit carriers like the carrier 30e shown in FIGS. 20 and 21.

It is to be further understood that after an IC chip or other circuit components have been embodied on a carrier of the present invention, a conventional protective lid will be secured over the top of the carrier and peripherally sealed, or else the top of the carrier will be potted. However, since such coverings do not form a part of the present invention, they have not been shown or described herein, except for the above description of how they may be attached to the carriers of the invention.

According to the second method of the invention for metallizing IC chip carriers or hybrid circuit carriers, a refractory metal is first applied as a conductor base, and then a noble metal, preferably gold, is applied as a covering over the refractory metal conductor. Some users of the IC carriers are used to having refractory metal conductor bases, which were an essential part of prior art IC carriers which had to be fired from the "green" stage with the metallization thereon, and such users sometimes prefer the presence of a refractory metal conductor base on surfaces of the ceramic body. Products of this second alternative method of the invention in which refractory metal is deposited on the ceramic carrier body are illustrated in FIGS. 22-25.

This refractory metal alternative method is applied, as before, to a matrix 10a of the ceramic carrier bodies 26. Referring to FIG. 22, a finished IC carrier having the refractory metal base is generally designated 100, and this may be either an IC chip carrier or a hybrid circuit carrier, with finished products 100 according to this method having arrays of conductors and circuit components generally similar to those illustrated in FIGS. 7-21. Thus, in FIG. 22, the finished IC carrier 100 is seen to be based upon one of the carrier bodies 26 which has a flat top surface 32, a flat bottom surface 34, and a series of the flat-bottomed, laser-machined grooves 44 in its edges. A single one of the refractory metal conductors 102 is shown, and has portions adhered to the top surface 32, the flat bottom surface of a groove 44, and the bottom surface 34, these portions forming a continuous conductor. A glass solder barrier strip 104 is in the form of a ring fused to the top surface 32 of carrier body 26 in the same manner as the solder barrier strip 58 of FIGS. 7 and 9-11, the glass solder barrier strip 104 covering a portion of the refractory metal conductor 102 on top surface 32. An outer conductor layer 106 of noble metal, preferably gold, overlies the refractory metal conductor strip 102 except in the region of the glass solder barrier 104.

The matrix 10a of carrier bodies 26 is made of sintered ceramic, preferably either alumina or beryllia, as described above in detail in connection with FIGS. 1-6, being fired in a high temperature oven at a primary temperature of at least approximately 1550° C. The refractory metal used for the conductor base 102 is preferably either a molybdenum-manganese alloy, tungsten, or an alloy combination of these. It is applied as a particulate metal paste or "ink" by a thick film screen-printing process, and then is fired to become fused and bonded to the ceramic, preferably at approximately 1400° C., and no higher than approximately 1425° C., to avoid causing any possible variation in the size or configuration of the ceramic matrix 10a. This approximately 1400° C. firing is performed in a high temperature oven, and is performed in a slightly reducing atmosphere as a positive deterrent to any possible oxidation of the refractory metal. This reducing atmosphere is preferably 5-15 percent hydrogen, with the remaining gas being nitrogen.

Next, the dielectric solder barrier strip 104 is applied onto the top surface 32 of carrier bodies 26 and over the refractory metal conductors 102. The dielectric 104 is preferably a high temperature glass which will withstand the later low temperature firing of the noble metal to be applied. Dielectric solder barrier strip 104 is preferably screen-printed on as a glass frit paste. This is then fired in a high temperature oven at a temperature substantially below the firing temperature for the refractory metal, but at a temperature substantially higher than the low temperature firing that will be applied to the noble metal overlay on the refractory metal. A suitable firing temperature for the glass is approximately 1300° C. which will fuse the glass strip 104, bonding it to the top surfaces 32 of carrier bodies 26 and to the refractory metal conductors 102. Although this firing stage could be taken as high as the approximately 1400° C. firing for the refractory metal, such higher temperature involves a more rapid cooling of the glass barrier 104 with the consequent possibility of warping of the carrier bodies 26. This firing stage for the glass dielectric barrier strip 104 is also conducted in a slightly reducing atmosphere, again preferably 5-15 percent hydrogen and the remainder nitrogen.

The presence of the refractory metal conductor base 102 permits the noble metal outer conductor layer 106, which is coextensive with the exposed portions of the refractory metal base 102, to be selectively plated onto the refractory metal without its having to be screen-printed as a paste. This plating is preferably accomplished by means of an electroless plating process known in the art. The noble metal outer layer 106 is preferably gold, but may alternatively be one of the other noble metal alloys described hereinabove as being usable for metallization in the present invention. The plating of the noble metal outer layer 106 onto the refractory metal 102 produces a loose molecular layering, so in order to fuse the noble metal and bond it to the refractory metal, the carrier matrix 10a is again fired, this being a low temperature firing in the range of approximately 950°-1000° C., which again needs to be in a reducing atmosphere.

By applying and firing the dielectric solder barrier strip 104 prior to the gold or other noble metal outer conductor layer 106, the amount of gold or other noble metal required to cover the refractory metal under the dielectic 104 is saved, and this adds up to a substantial amount of gold in mass production. Nevertheless, alternatively, the gold or other noble metal may be plated onto the refractory metal conductor base 102 prior to application of the dielectric strip 104, and in this case the gold or other noble metal will cover the entire lengths of the refractory metal conductors 102. This alternative construction is illustrated in FIG. 23, wherein the gold or other noble metal conductor is designated 106a and is fully coextensive with the refractory metal conductor 102. In this case, the dielectric solder barrier 104a is applied after the gold or other noble metal has been plated and fired, preferably in the range of approximately 950°-1000° C., and then the dielectric solder barrier 104a is screen-printed as a low temperature glass frit paste or other solder barrier material as described in detail above in connection with the solder barrier strip 58 shown in FIGS. 7 and 9-11, and this is then fired at a substantially lower temperature than the firing temperature for the gold or other noble metal. In this case, the dielectric solder barrier 104a may even be a high temperature plastic material suitable for withstanding the heat involved in soldering.

A problem with a gold outer conductor layer in the region of the flats of grooves 44 and bottom surface 34 of carrier bodies 26 where solder is applied is that gold readily leaches in a tin-lead solder bath, so that the gold can only withstand on the order of about 30 seconds of exposure to hot solder. This solder exposure time can be greatly extended, for example up to on the order of about 5–10 minutes, by providing a nickel barrier strip between the refractory metal conductor 102 and the gold conductor 106 or 106a in these regions where solder is applied. This modification is illustrated in FIG. 24, wherein a nickel layer 108 is interposed between the refractory metal layer 102 and the gold conductor layer 106 in the regions of the flats of grooves 44 and the bottom surfaces 34 of carrier bodies 26. The nickel layer 108 is first plated onto the refractory metal conductor 102, preferably by electroless plating, and then the gold or other noble metal conductor 106 is plated over the nickel layer 108 and is plated onto the exposed refractory metal conductor 102 on top surface 32, also preferably by electroless plating, and then both the nickel and gold or other noble metal may be simultaneously fired, preferably in the range of approximately 950°–1000° C., in the slightly reducing atmosphere previously described.

If desired, the entire exposed refractory metal conductor 102 may be thus first plated with nickel and then plated with gold, as shown in FIG. 25, in which the nickel plating is designated 108a.

While these embodiments having the intermediate nickel layer have been shown in FIGS. 24 and 25 relative to the form of the invention shown in FIG. 22 wherein the dielectric barrier strip 104 is applied to cover the refractory metal conductor 102 before application of the nickel and noble metal layers, it is to be understood that the nickel layering may alternatively be applied relative to the form of the invention shown in FIG. 23 wherein the dielectric solder barrier 104a would be applied after the nickel and gold or other noble metal layers had been applied and fired.

FIG. 26 illustrates a third method for applying the metallization to a matrix 10a of IC carrier bodies 26 according to the present invention. According to this method, the entire matrix 10a of interconnected carrier bodies 26 has a very thin copper plating 109 applied to the ceramic by means of an electroless plating procedure that is proprietary to the Kollmorgen Corporation, located at 322 S. Service Road, Melville, N.Y. 11747. This initial overall electroless copper plating 109 bonds well to the ceramic, and may be very thin, as for example as little as 2 microns in thickness, and it provides a bonding base to the ceramic for a series of additional platings which permit the complete elimination of firing of the metallization. Then, after this thin copper plating 109 is adhered to the entire matrix 10a of carrier bodies 26, a first additional, thicker plating of copper conductors 110 is applied onto the top surfaces 32, the flat bottoms of the side grooves 44, and the bottom surfaces 34 of the carrier bodies 26 in conductor patterns like those illustrated in FIGS. 7–21 of the drawings; and then additional coextensive platings of nickel conductors 112 and gold or other noble metal conductors 114 are applied. Because of the continuum of the initial thin copper plating 109 on the entire interconnected matrix 10a of carrier bodies 26, it is convenient to perform these further plating steps to provide the conductors 110, 112 and 114 by electrolytic plating, usually photolithographic patterning. Then, after the copper, nickel and gold conductor platings 110, 112 and 114, respectively, have been applied, the overall very thin base copper plating 109 is etched off of the ceramic matrix 10a and hence off of all surfaces of the individual IC carrier bodies 26 except under where the conductors 110, 112 and 114 lie. The outer conductor 114 of gold or other noble metal is substantially unaffected by such etching Then a low temperature glass or other dielectric solder barrier 104b is applied and low temperature fired as required to complete the IC carrier.

The fourth method for applying the metallization to a matrix 10a of the IC carrier bodies 26 according to the invention provides metal layering similar to the third method, so that FIG. 26 illustrates the fourth method as well as the third method. The fourth method utilizes a procedure known in the art as a "thin film" process. First, an overall very thin sputtered film of titanium-tungsten is applied to the ceramic, preferably less than approximately Å in thickness. Then an overall thin sputtered film of copper is applied over the titanium-tungsten film, preferably approximately 3500 Å in thickness. These two overall sputtered films are represented by the layer 34 in FIG. 26. Then a sequence of three electrolytic platings, represented by the layers 110, 112 and 114 in FIG. 26, is applied with photolithographic patterning, preferably approximately 0.00020 to 0.00030 inch copper, approximately 0.000050 inch nickel, and at least approximately 0.000050 inch gold or other noble metal. Finally, the sputtered layers of titanium-tungsten and copper are chemically etched off of the unpatterned areas of the ceramic.

While the present invention has been described herein with reference to presently preferred embodiments, it is to be understood that various modifications may be made by those skilled in the art without departing from the scope and spirit of the invention as set forth in the appended claims.

I claim:

1. The method of making a matrix of IC carriers which comprises:
   providing a generally flat sheet ceramic blank which has been sintered by means of a primary, high temperature firing;
   laser-machining a first plurality of parallel, straight-line sequences of elongated, substantially straight-sided slots in said fired ceramic blank; and
   laser-machining a second plurality of said sequences in said fired ceramic blank which is orthogonal to and intersecting with said first plurality of sequences;
   said IC carriers being defined between adjacent pairs of said first sequences and adjacent pairs of said second sequences.

2. The method of claim 1, wherein said blank comprises alumina.

3. The method of claim 1, wherein said blank comprises beryllia.

4. The method of claim 1, wherein said primary, high temperature firing was at a temperature of at least approximately 1550° C.

5. The method of claim 1, wherein each of said sequences comprises an alternating sequence of a plurality of said slots and a plurality of scribes.

6. The method of claim 5, wherein each of said scribes is made by laser-machining a series of closely spaced, discrete scribe recesses.

7. The method of claim 6, wherein said slots and said scribe recesses are laser-machined in sequence by the same laser, and wherein said laser is in the middle infrared radiation range.

8. The method of claim 7, wherein said laser is a carbon dioxide laser.

9. The method of claim 7, wherein said scribe recesses are laser-machined to a substantially conical configuration.

10. The method of claim 9, wherein said scribe recesses extend from a flat surface of said ceramic blank through not more than approximately one-half of the thickness of said blank.

11. The method of claim 1, wherein the substantially straight sides of said slots are substantially flat and oriented substantially normal to the general plane of said blank.

12. The method of claim 1, wherein "X's" of four of said slots are laser-machined so as to communicate with each other where at least some of said first sequences intersect with at least some of said second sequences.

13. The method of claim 7, wherein the laser-machining of said slots is performed while delivering a focused laser beam to said blank through laser delivery means located at a first level spaced from and parallel to the general plane of said blank, and said laser-machining of said scribe recesses is performed while delivering a focused laser beam to said blank through said laser delivery means located at a second level spaced from and parallel to the general plane of said blank 14. The method of claim 13, wherein said second level is spaced further from said blank than said first level.

15. The method of claim 1, which comprises applying conductive metallization material to said blank after said laser-machining.

16. The method of claim 15, which comprises fixing said metallization material by secondary firing at a temperature substantially lower than said primary firing temperature.

17. The method of claim 15, wherein said metallization material comprises noble metal material.

18. The method of claim 17, wherein said noble metal material comprises one or more noble metals selected from the group consisting of gold, platinum, palladium and silver.

19. The method of claim 18, which comprises fixing said noble metal material by a secondary firing at a temperature substantially lower than said primary firing temperature and in the range of from approximately 850° C. to approximately 1000° C.

20. The method of claim 15, wherein said metallization material comprises refractory metal material.

21. The method of claim 20, wherein said refractory metal material comprises one or more refractory metals selected from the group consisting of tungsten, molybdenum and manganese.

22. The method of claim 21, which comprises fixing said refractory metal material by a secondary firing at a temperature substantially lower than said primary firing temperature and not greater than approximately 1425° C.

23. The method of claim 15, wherein said metallization material comprises a first layer of refractory metal material bonded to said blank, and a second layer of noble metal material bonded to said first layer 24. The method of claim 23, which comprises fixing said first layer by a first secondary firing at a temperature substantially lower than said primary firing temperature prior to application of said second layer, and then after application of said second layer, fixing said second layer by a second secondary firing at a temperature substantially lower than said first secondary firing temperature.

25. The method of claim 15, wherein said metallization comprises a first layer of refractory metal material bonded to said blank, a second layer of nickel metal material bonded to said first layer, and a third layer of noble metal material bonded to said second layer.

26. The method of claim 25, which comprises fixing said first layer by a first secondary firing at a temperature substantially lower than said primary firing temperature prior to application of said second and third layers, and then after application of said second and third layers, simultaneously fixing said second and third layers by a second secondary firing at a temperature substantially lower than said first secondary firing temperature.

27. The method of claim 15, which comprises:
electrolessly applying a very thin first plating of copper over substantially the entire said ceramic matrix;
electrolytically applying a second plating of copper over limited patterned areas of said first plating;
electrolytically applying a third plating of noble metal material over said second plating; and
etching away said first plating of copper where it is not covered by said second and third platings.

28. The method of claim 27, which comprises electrolytically applying a plating of nickel over said second plating of copper before applying said third plating of noble metal material, and then applying said third plating of noble metal material over said nickel plating and performing said etching.

29. The method of claim 15, which comprises:
sputtering a very thin first layer of titanium-tungsten over substantially the entire said ceramic matrix;
sputtering a thin second layer of copper over substantially the entire said first layer;
electrolytically plating a third layer of copper over limited patterned area of said second layer;
electrolytically plating a fourth layer of nickel over said third layer;
electrolytically plating a fifth layer of noble metal over said fourth layer; and
etching away said first and second layers where they are not covered by said third, fourth and fifth layers.

30. The method of claim 15, which comprises vacuum drawing metallization paste through said slots so as to apply said metallization paste discretely to said substantially flat sides of said slots and excluding it from the ends of said slots, whereby the ends of said slots consist of electrically insulative ceramic material and all of said IC carriers in said matrix remain electrically isolated from each other; and
firing said metallization paste at a secondary firing temperature substantially lower than said primary firing temperature to fix said metallization on said substantially flat sides of said slots and excluded from the ends of said slots.

* * * * *